(12) United States Patent
An et al.

(10) Patent No.: US 9,634,144 B2
(45) Date of Patent: Apr. 25, 2017

(54) SEMICONDUCTOR DEVICES AND METHODS OF FABRICATING THE SAME

(71) Applicant: Samsung Electronics Co., Ltd., Suwon-si, Gyeonggi-do (KR)

(72) Inventors: Tae-Hyun An, Seoul (KR); Gab-Jin Nam, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/658,306

(22) Filed: Mar. 16, 2015

(65) Prior Publication Data
US 2015/0340490 A1    Nov. 26, 2015

(30) Foreign Application Priority Data
May 23, 2014 (KR) ........................ 10-2014-0062276

(51) Int. Cl.
| | | |
|---|---|---|
| H01L 29/78 | (2006.01) |
| H01L 27/088 | (2006.01) |
| H01L 29/423 | (2006.01) |
| H01L 29/66 | (2006.01) |
| H01L 29/786 | (2006.01) |
| H01L 29/06 | (2006.01) |
| H01L 29/165 | (2006.01) |

(52) U.S. Cl.
CPC ........ *H01L 29/785* (2013.01); *H01L 27/0886* (2013.01); *H01L 29/0673* (2013.01); *H01L 29/42356* (2013.01); *H01L 29/42392* (2013.01); *H01L 29/66545* (2013.01); *H01L 29/78618* (2013.01); *H01L 29/78696* (2013.01); *H01L 29/165* (2013.01); *H01L 29/7848* (2013.01)

(58) Field of Classification Search
CPC .............. H01L 29/785; H01L 27/0886; H01L 29/42356; H01L 29/7851; H01L 29/7856; H01L 2029/7858; H01L 21/823431; H01L 21/823828; H01L 21/845; H01L 27/0924; H01L 27/10826; H01L 27/1089; H01L 29/41791; H01L 29/66795; H01L 29/7831; H01L 29/786; H01L 2924/13067
See application file for complete search history.

(56) References Cited

U.S. PATENT DOCUMENTS

| | | | |
|---|---|---|---|
| 6,417,548 B1 * | 7/2002 | Sheu ..................... | H01L 27/112 257/391 |
| 7,253,060 B2 | 8/2007 | Yun et al. | |
| 7,648,883 B2 | 1/2010 | Park | |
| 7,709,277 B2 | 5/2010 | Lee et al. | |
| 8,129,777 B2 | 3/2012 | Kim et al. | |
| 8,314,464 B2 | 11/2012 | Iwayama et al. | |

(Continued)

FOREIGN PATENT DOCUMENTS

| | | |
|---|---|---|
| JP | 2005-353618 | 12/2005 |
| KR | 1020080011488 | 2/2008 |

*Primary Examiner* — Galina Yushina
(74) *Attorney, Agent, or Firm* — Myers Bigel, P.A.

(57) ABSTRACT

Semiconductor devices and methods of fabricating the semiconductor devices are provided. The semiconductor devices may include a fin disposed on a substrate. The fin may include an insulating layer pattern disposed in a top surface of the fin. The semiconductor devices may also include a wire pattern disposed on the insulating layer pattern to be separated from the insulating layer pattern and a gate electrode surrounding the wire pattern.

3 Claims, 50 Drawing Sheets

(56) References Cited

U.S. PATENT DOCUMENTS

| | | | |
|---|---|---|---|
| 2004/0235252 A1* | 11/2004 | Cho | H01L 21/823418 438/289 |
| 2006/0240622 A1 | 10/2006 | Lee et al. | |
| 2008/0017934 A1* | 1/2008 | Kim | H01L 29/0657 257/401 |
| 2008/0020537 A1* | 1/2008 | Kim | H01L 29/42392 438/308 |
| 2010/0155827 A1* | 6/2010 | Kim | H01L 29/42392 257/327 |
| 2013/0270512 A1 | 10/2013 | Radosavljevic et al. | |
| 2014/0070316 A1* | 3/2014 | Chan | H01L 21/823412 257/347 |
| 2015/0053928 A1* | 2/2015 | Ching | H01L 21/823821 257/29 |

\* cited by examiner

SEMICONDUCTOR DEVICES AND METHODS OF FABRICATING THE SAME

CROSS-REFERENCE TO RELATED APPLICATION

This U.S. non-provisional application claims priority under 35 U.S.C. §119 to Korean Patent Application No. 10-2014-0062276 filed on May 23, 2014 in the Korean Intellectual Property Office, the disclosure of which is incorporated herein by reference in its entirety.

BACKGROUND

The present disclosure relates to a semiconductor device and a method of fabricating the same, and more particularly, to a semiconductor device having a gate-all-around structure and a method of fabricating the semiconductor device.

As a scaling technique for increasing the density of semiconductor devices, a gate-all-around structure has been suggested. In the gate-all-around structure, a nanowire-shaped silicon body is formed on a substrate, and a gate is formed to surround the silicon body.

The gate-all-around structure can be easily scaled because it uses a three-dimensional (3D) channel. In addition, the current control capability can be improved without the need to increase the length of the gate. Moreover, it is possible to effectively suppress a short channel effect (SCE) in which an electric potential of a channel region is affected by a drain voltage.

SUMMARY

Example embodiments provide semiconductor devices in which a parasitic channel disposed under a primary channel in a transistor having a gate-all-around structure is removed to improve the performance of the element.

Example embodiments also provide methods of fabricating a semiconductor device in which a parasitic channel disposed under a primary channel in a transistor having a gate-all-around structure is removed to improve the performance of the element.

However, example embodiments are not restricted to the one set forth herein. The above and other example embodiments will become more apparent to one of ordinary skill in the art to which the present disclosure pertains by referencing the detailed description of the present disclosure given below.

According to example embodiments, there is provided a semiconductor device comprising a fin disposed on a substrate, the fin including an insulating layer pattern disposed in a top surface of the fin, a wire pattern disposed on the insulating layer pattern to be separated from the insulating layer pattern, and a gate electrode surrounding the wire pattern.

The semiconductor device may further comprise source/drain regions disposed on both sides of the gate electrode, and the source/drain regions are connected to the wire pattern.

Each of the source/drain regions includes a first semiconductor pattern and a second semiconductor pattern stacked sequentially on the top surface of the fin, and the first and second semiconductor patterns includes different materials from each other, the second semiconductor pattern is an extended portion of the wire pattern, and the gate electrode is disposed between the first semiconductor patterns.

Each of the source/drain regions includes an epitaxial layer which includes a first portion and a second portion and is disposed on the top surface of the fin, and the wire pattern is disposed between the first portions, and the gate electrode is disposed between the second portions.

The semiconductor device may further comprise an epitaxial seed film which is disposed between each of the source/drain regions and the top surface of the fin.

The semiconductor device may further comprise an epitaxial seed film which includes a first portion disposed between each of the source/drain regions and the top surface of the fin, and a second portion disposed between each of the source/drain regions and the wire pattern, and the epitaxial seed film and the epitaxial layer include different materials from each other.

At least a part of each of the source/drain regions is located on the insulating layer pattern.

The whole bottom surface of each of the source/drain regions overlaps the insulating layer pattern.

The fin further comprises an insertion pattern which is disposed under the insulating layer pattern.

The semiconductor device may further comprise a gate insulating layer which is disposed between the wire pattern and the gate electrode, and gate spacers which are disposed on both sides of the gate electrode, and the gate insulating layer is disposed along sidewalls of the gate spacers.

According to other example embodiments, there is provided a semiconductor device comprising a field insulating layer which is disposed on a substrate and includes an opening having long sides extending along a first direction and short sides extending along a second direction different from the first direction, a first insulating layer pattern which is disposed on the substrate and has long sides extending along the first direction and short sides extending along the second direction, the long sides of the first insulating layer pattern contacting the long sides of the opening, a first wire pattern which is disposed on the first insulating layer pattern to be separated from the first insulating layer pattern and extends along the first direction, and a first gate electrode disposed on the field insulating layer and the first insulating layer pattern to surround the first wire pattern.

A top surface of the first insulating layer pattern may protrude further upward than a top surface of the field insulating layer.

The field insulating layer may be thicker than the first insulating layer pattern.

The semiconductor device may further comprise a second insulating layer pattern which is disposed on the substrate and has long sides extending along the first direction and short sides extending along the second direction, and a second wire pattern which is disposed on the second insulating layer pattern to be separated from the second insulating layer pattern and extends along the first direction, a second gate electrode which is disposed on the field insulating layer and the second insulating layer pattern to surround the second wire pattern, and source/drain regions which are connected to the first wire pattern and the second wire pattern, respectively, and the long sides of the second insulating layer pattern may contact the long sides of the opening.

The semiconductor device may further comprise a semiconductor pattern which protrudes from the substrate and is disposed in the opening, and the semiconductor pattern includes a first portion and second portions disposed on both sides of the first portion in the first direction.

The first insulating layer pattern and the second insulating layer pattern are respectively disposed on the second portion of the semiconductor pattern, and each of the source/drain regions is located on the first portion of the semiconductor pattern.

According to still other example embodiments, there is provided a semiconductor device comprising a fin which is disposed on a substrate and includes a semiconductor pattern and an insulating layer pattern stacked sequentially, a wire pattern which is disposed on the fin and is separated from the insulating layer pattern, a gate electrode which surrounds the wire pattern, and source/drain regions which are disposed on the insulating layer pattern on both sides of the gate electrode.

A bottom surface of each of the source/drain regions may contact the insulating layer pattern.

The semiconductor device may further comprise an epitaxial seed film which is disposed between each of the source/drain regions and the insulating layer pattern, and the epitaxial seed film may include a material different from a material of the wire pattern.

The semiconductor device may further comprise an epitaxial seed film which is disposed between each of the source/drain regions and the wire pattern, and the epitaxial seed film may include a material different from a material of the source/drain regions.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
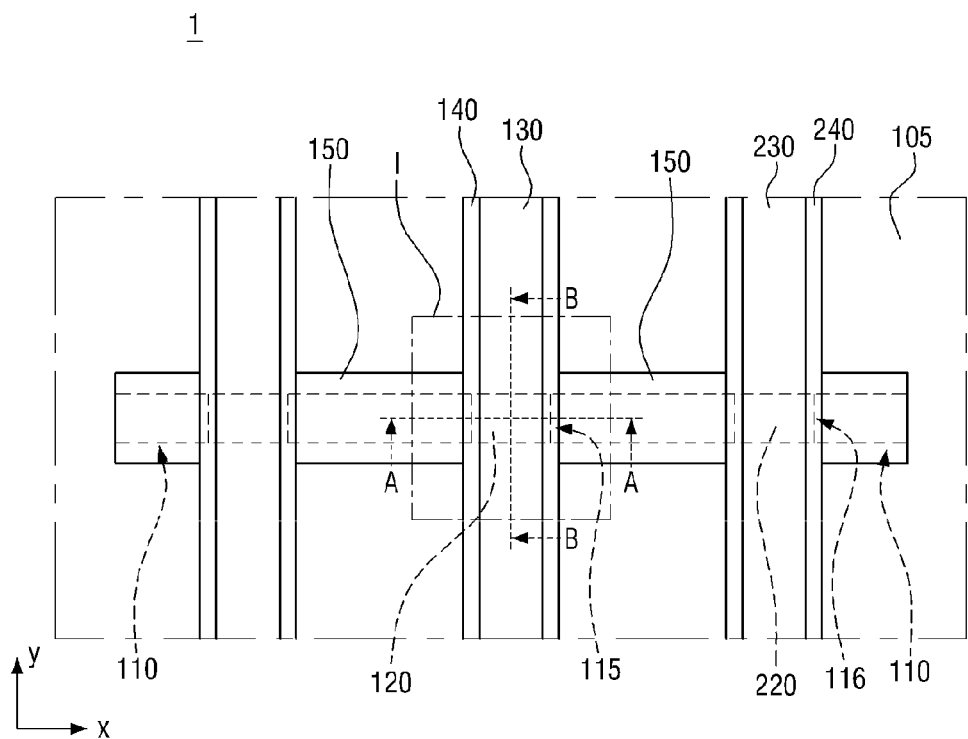
FIG. 1 is a plan view of a semiconductor device according to an example embodiment.

The present inventive concept will now be described more fully hereinafter with reference to the accompanying drawings, in which example embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component, a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

A semiconductor device according to an example embodiment will now be described with reference to FIGS. 1 through 5.

Figure 2A:
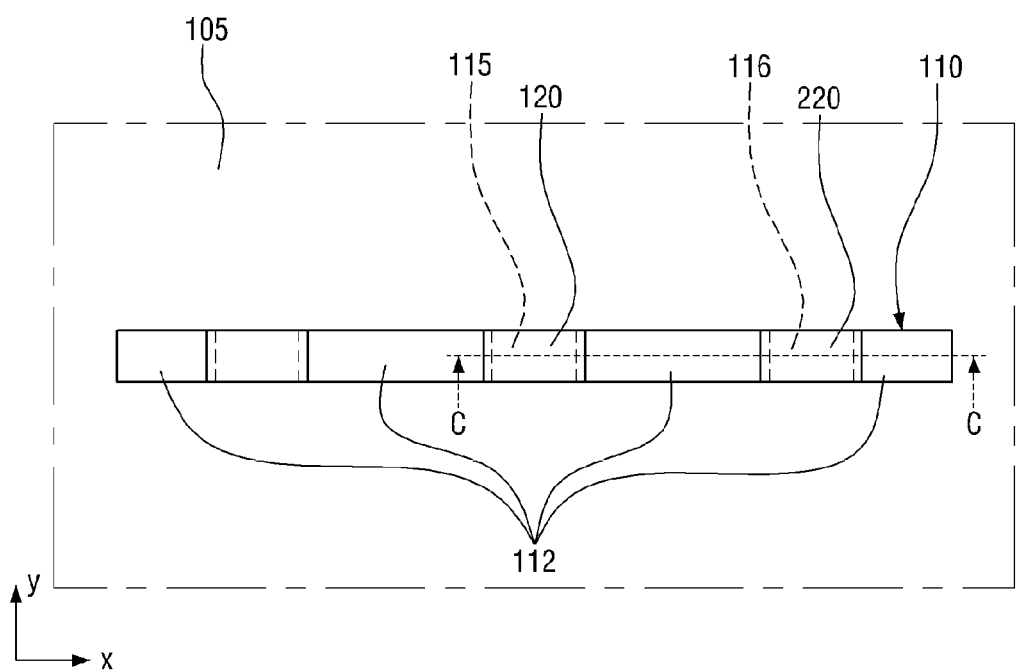
FIG. 2A is a plan view of a fin-type pattern, first and second wire patterns, and a field insulating layer illustrated in FIG. 1.
Figure 2B:
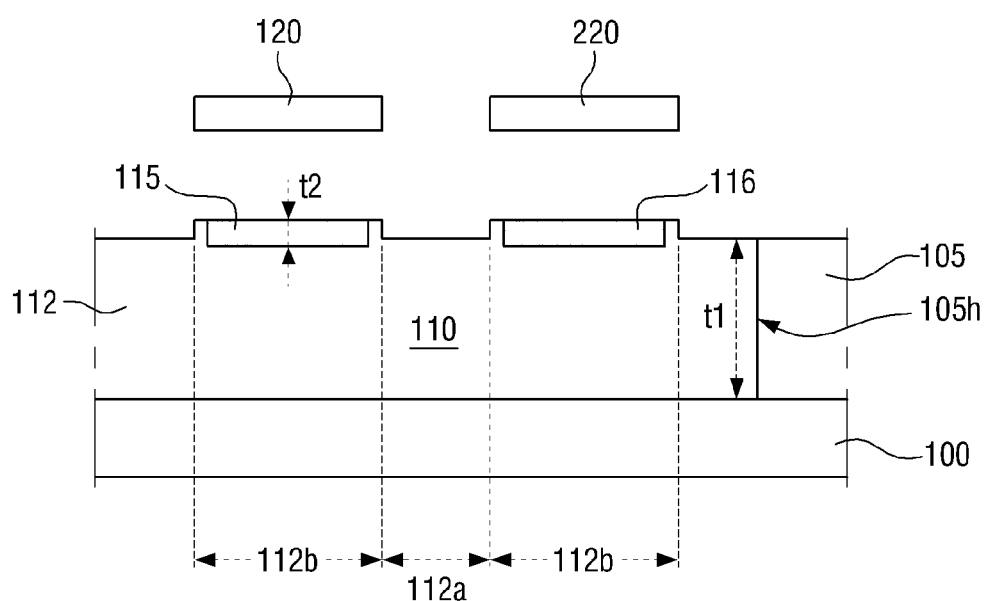
FIG. 2B is a cross-sectional view taken along the line C-C of FIG. 2A.
Figure 3:
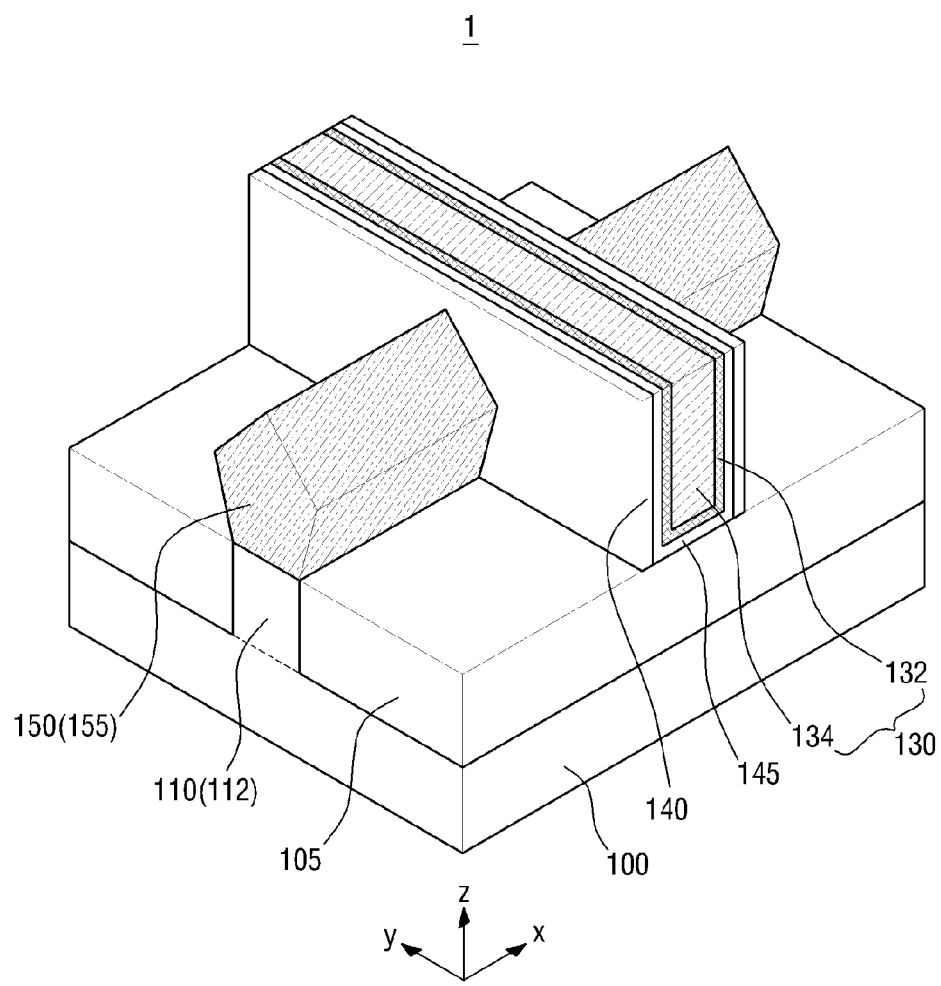
FIG. 3 is a perspective view of the portion 'I' of FIG. 1.
Figure 4:
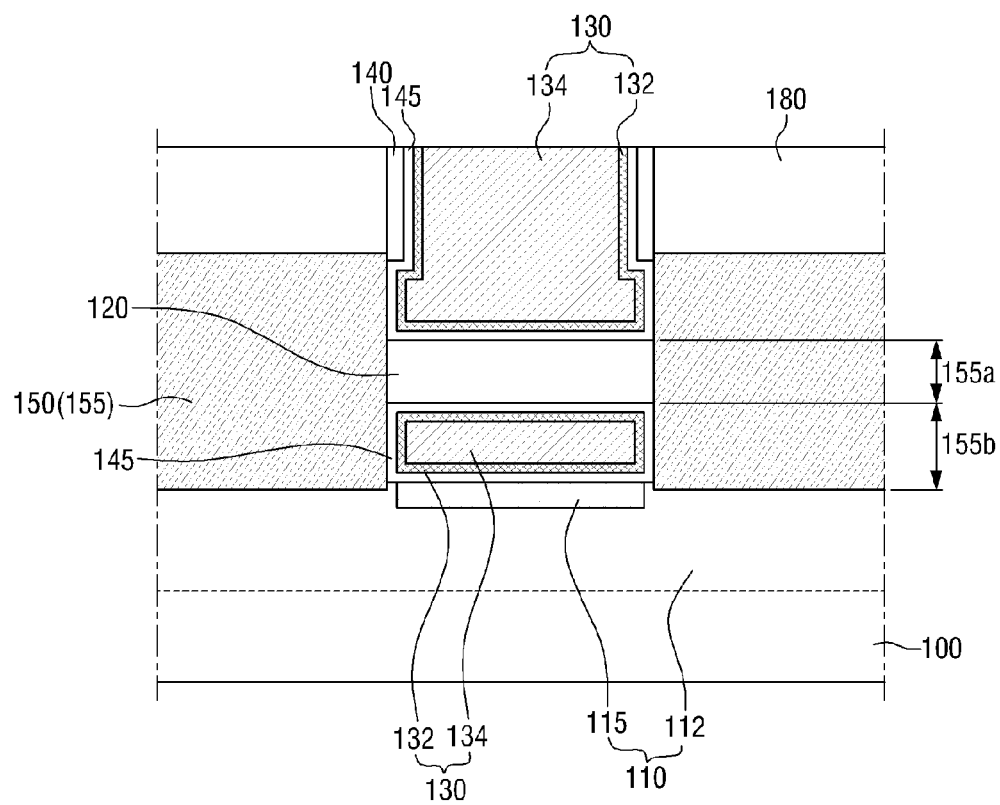
FIG. 4 is a cross-sectional view taken along the line A-A of FIG. 1.
Figure 5:
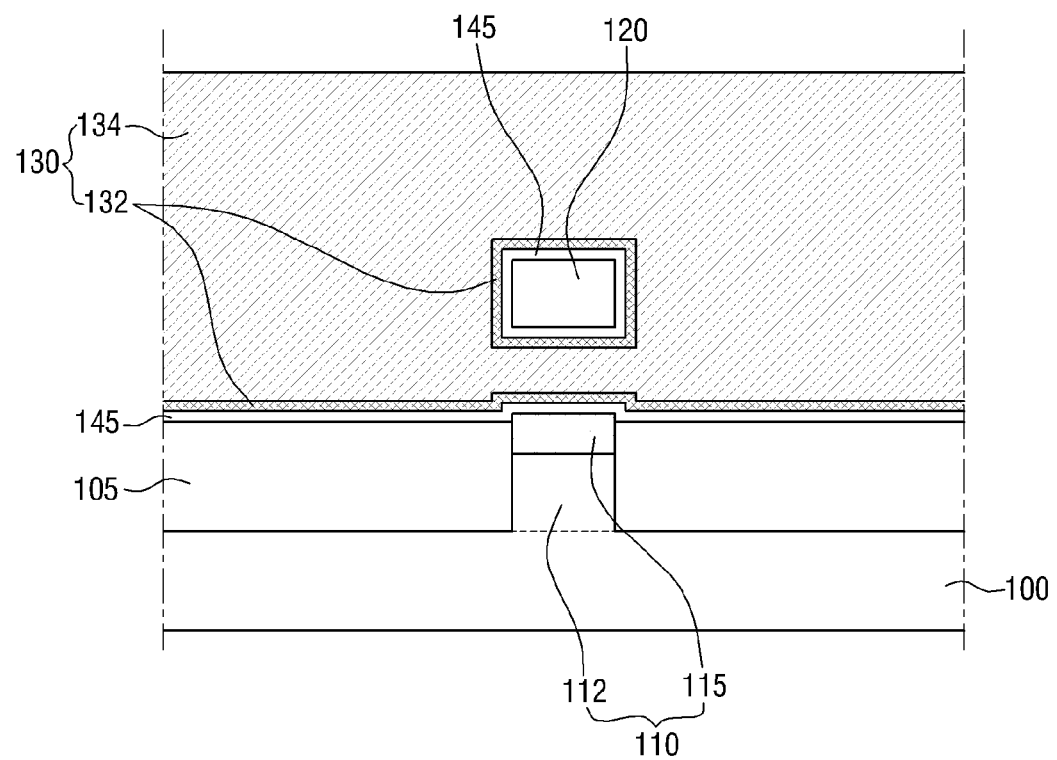
FIG. 5 is a cross-sectional view taken along the line B-B of FIG. 1.

FIG. 1 is a plan view of a semiconductor device 1 according to an example embodiment. FIG. 2A is a plan view of a fin-type pattern 110, first and second wire patterns 120 and 220, and a field insulating layer 105 illustrated in FIG. 1. FIG. 2B is a cross-sectional view taken along the line C-C of FIG. 2A. FIG. 3 is a perspective view of the portion 'I' of FIG. 1. FIG. 4 is a cross-sectional view taken along the line A-A of FIG. 1. FIG. 5 is a cross-sectional view taken along the line B-B of FIG. 1. For purposes of description, an interlayer insulating film 180 is not illustrated in FIG. 3.

Referring to FIGS. 1 through 2B, the semiconductor device 1 according to an example embodiment includes a substrate 100, the field insulating layer 105, the fin-type pattern 110, the first wire pattern 120, source/drain regions 150, and a first gate electrode 130.

The substrate 100 may be, for example, a bulk silicon substrate or a silicon-on-insulator (SOI) substrate. In some embodiments, the substrate 100 may be a silicon substrate or may be a substrate formed of another material such as silicon germanium, indium antimonide, lead telluride, indium arsenide, indium phosphide, gallium arsenide, or gallium antimonide. In some embodiments, the substrate 100 may include a base substrate having an epitaxial layer disposed thereon.

The field insulating layer 105 is formed on the substrate 100. The field insulating layer 105 includes an opening 105h. The opening 105h may extend along a first direction X. In other words, the opening 105h may include long sides extending along the first direction X and short sides extending along a second direction Y.

The field insulating layer 105 may include one of, e.g., an oxide layer, a nitride layer, an oxynitride layer, and combinations thereof.

The fin-type pattern 110 may extend along the first direction X. In other words, the fin-type pattern 110 may include long sides extending along the first direction X and short sides extending along the second direction Y.

The fin-type pattern 110 is formed on the substrate 100. The fin-type pattern 110 may protrude from the substrate 100. At least a part of sidewalls of the fin-type pattern 110 may be disposed to be contiguous with the field insulating layer 105. Therefore, the fin-type pattern 110 is defined by the field insulating layer 105.

In FIG. 2B, at least a part of the fin-type pattern 110 protrudes further upward than a top surface of the field insulating layer 105, but example embodiments is not limited thereto.

The fin-type pattern 110 includes a lower pattern 112 and a first upper pattern 115 and a second upper pattern 116. The lower pattern 112 is a semiconductor pattern including a semiconductor material. Each of the first upper pattern 115 and the second upper pattern 116 is an insulating layer pattern including an insulating material.

For the convenience of explanation, semiconductor devices according to example embodiments will be described based on the assumption that the lower pattern 112 includes silicon.

Since the fin-type pattern 110 is formed to be contiguous with the field insulating layer 105, sidewall of the lower pattern 112 is surrounded by the field insulating layer 105.

The first upper pattern 115 and the second upper pattern 116 are formed in a top surface of the fin-type pattern 110. In other words, at least a part of the top surface of the fin-type pattern 110 may be a top surface of the first upper pattern 115 and a top surface of the second upper pattern 116.

In some embodiments, the lower pattern 112 may be exposed between the first upper pattern 115 and the second upper pattern 116. In other words, a semiconductor pattern and an insulating pattern may be alternately arranged with each other along the first direction X in the top surface of the fin-type pattern 110.

In the semiconductor device 1 according to the example embodiment, the first upper pattern 115 and the second upper pattern 116 do not contact each other.

The first upper pattern 115 and the second upper pattern 116 are formed on the lower pattern 112. For example, the lower pattern 112 includes a first portion 112a and second portions 112b disposed on both sides of the first portion 112a in the first direction X. The first upper pattern 115 and the second upper pattern 116 may be formed on the second portions 112b of the lower pattern 112, respectively.

The first upper pattern 115 and the second upper pattern 116 are separated from the substrate 100. Therefore, the lower pattern 112 is disposed between the first upper pattern 115 and the substrate 100 and between the second upper pattern 116 and the substrate 100.

In addition, the first portion 112a of the lower pattern 112 may be located between the first upper pattern 115 and the second upper pattern 116.

Each of the first upper pattern 115 and the second upper pattern 116 may include long sides extending along the first direction X and short sides extending along the second direction Y. As illustrated in FIG. 2A, the long sides of the first upper pattern 115 and the long sides of the second upper pattern 116 may contact the long sides of the opening 105h of the field insulating layer 105. In addition, the first portion 112a of the lower pattern 112 is located between the short side of the first upper pattern 115 and the short side of the second upper pattern 116.

In FIG. 2B, the top surface of the first upper pattern 115 and the top surface of the second upper pattern 116 protrude further upward than the top surface of the field insulating layer 105, but example embodiments are not limited thereto.

Furthermore, the field insulating layer 105 has a first thickness t1, and the first upper pattern 115 (i.e., the insulating layer pattern) has a second thickness t2. In semiconductor devices according to example embodiments, the thickness t1 of the field insulating layer 105 is different from the thickness t2 of the first upper pattern 115. More specifically, the thickness t1 of the field insulating layer 105 is greater than the thickness t2 of the first upper pattern 115. This is because the field insulating layer 105 and the first upper pattern 115 are formed by different processes.

The first wire pattern 120 is formed above the substrate 100. The first wire pattern 120 extends along the first direction X. The first wire pattern 120 is formed on the first upper pattern 115 to be separated from the first upper pattern 115. The first wire pattern 120 overlaps the first upper pattern 115.

The second wire pattern 220 is formed above the substrate 100 to extend along the first direction X. The second wire pattern 220 is formed on the second upper pattern 116 to be separated from the second upper pattern 116. The second wire pattern 220 overlaps the second upper pattern 116.

In other words, the first wire pattern 120 and the second wire pattern 220 are formed not on the field insulating layer 105 but on the fin-type pattern 110. Specifically, the first wire pattern 120 and the second wire pattern 220 are formed on corresponding insulating layer patterns, for example, the first upper pattern 115 and the second upper pattern 116, respectively.

In FIG. 2A, a width of the first wire pattern 120 in the second direction Y is equal to a width of the first upper wire 115 in the second direction Y, and a width of the second wire pattern 220 in the second direction Y is equal to a width of the second upper pattern 116 in the second direction Y. However, this is merely an example used for purposes of description, and example embodiments are not limited thereto.

The first wire pattern 120 and the second wire pattern 220 can be used as channel regions. The first wire pattern 120 and the second wire pattern 220 may vary according to whether the semiconductor device 1 is a p-type metal oxide semiconductor (PMOS) or an n-type metal oxide semiconductor (NMOS).

In addition, each of the first wire pattern 120 and the second wire pattern 220 may include the same material as the lower pattern 112 of the fin-type pattern 110 or may include a different material from the material of the lower pattern 112.

For purposes of description, semiconductor devices according to example embodiments will be described based on the assumption that each of the first wire pattern 120 and the second wire pattern 220 includes silicon.

A first gate electrode 130 and a second gate electrode 230 are formed on the field insulating layer 105 and the fin-type patter 110. Specifically, the first gate electrode 130 is formed on the field insulating layer 105 and the first upper pattern 115, and the second gate electrode 230 is formed on the field insulating layer 105 and the second upper pattern 116.

The first gate electrode 130 and the second gate electrode 230 extend along the second direction Y.

In addition, the first gate electrode 130 surrounds the first wire pattern 120, and the second gate electrode 230 surrounds the second wire pattern 22Q. This will be described later with reference to FIG. 5.

The source/drain regions 150 are disposed on both sides of the first gate electrode 130. For example, the source/drain regions 150 may be disposed on both sides of the first gate electrode 130 in the first direction X.

The source/drain regions 150 are formed on the fin-type pattern 110. For example, each of the source/drain regions 150 may be located on the first portion 112a of the lower pattern 112. Each of the source/drain regions 150 is connected to the first wire pattern 120 and the second wire pattern 220 disposed on both sides thereof.

One of a plurality of transistors illustrated in FIGS. 1 through 2B will now be described.

Referring to FIGS. 3 through 5, at least a part of sidewalls of the fin-type pattern 110 may contact the field insulating layer 105. At least a part of the fin-type pattern 110 may protrude further upward than the top surface of the field insulating layer 105.

The top surface of the first upper pattern 115 (i.e., the insulating layer pattern) of the fin-type pattern 110 protrudes further upward than the top surface of the field insulating layer 105. Part of the sidewalls of the first upper pattern 115 contacts the field insulating layer 105.

The first gate electrode 130 extends along the second direction Y. The first gate electrode 130 surrounds the first wire pattern 120 separated from the fin-type pattern 110, for example, the first upper pattern 115. In other words, the first gate electrode 13Q is also formed in a space between the first wire pattern 120 and the fin-type pattern 110.

The first gate electrode 130 may include metal layers (132, 134). As illustrated in the drawings, the first gate electrode 130 may be formed by stacking two or more metal layers (132, 134), but the present inventive concept is not limited thereto. A first metal layer 132 may be a metal layer for controlling a work function. The first metal layer 132 may be formed not only around the first wire pattern 120 but also along the top surface of the field insulating layer 105 and the top surface of the first upper pattern 115. A second metal layer 134 fills a space formed by the first metal layer 132.

For example, the first metal layer 132 may include at least one of TiN, WN, TaN, Ru, TiC, TaC, Ti, Ag, Al, TiAl, TiAlN, TiAlC, TaCN, TaSiN, Mn, and Zr. In addition, the second metal layer 134 may include W or Al. In some embodiments, the first gate electrode 130 may be formed of a material (e.g., Si or SiGe) other than metal. The first gate electrode 130 may be formed by, but not limited to, a replacement process.

Gate spacers 140 may be formed on sidewalls of the first gate electrode 130 extending along the second direction Y. The gate spacers 140 may include at least one of silicon nitride (SiN), silicon oxynitride (SiON), silicon oxide (SiO$_2$), silicon oxycarbonitride (SiOCN), and combinations of the same.

In the drawings, each of the gate spacers 140 is illustrated as a single layer. However, the present inventive concept is not limited thereto, and each of the gate spacers 140 may also have a multilayer structure.

A gate insulating layer 145 may be formed between the first wire pattern 120 and the first gate electrode 130. In addition, the gate insulating layer 145 may be formed between the field insulating layer 105 and the first gate electrode 130 and between the fin-type pattern 110 and the first gate electrode 130.

The gate insulating layer 145 may be conformally formed around the first wire pattern 120. In addition, the gate insulating layer 145 may be formed along the top surface of the field insulating layer 105 and the top surface of the first upper pattern 115.

Furthermore, the gate insulating layer 145 may be formed along sidewalls of the gate spacers 140. In addition, the gate insulating layer 145 may be formed along some surfaces of the source/drain regions 150.

The gate insulating layer 145 may include a high-k dielectric material having a higher dielectric constant than a silicon oxide layer. For example, the gate insulating layer 145 may include one or more of, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In FIG. 4, the gate spacers 140 are separated from the first wire pattern 120 in a third direction Z. In addition, at least the gate insulating layer 145 may be formed in a space between the first wire pattern 120 and the gate spacers 140. The reason that the gate spacers 140 and the first wire pattern 120 are separated in the third direction Z will be described later in relation to a method of fabricating a semiconductor device.

The source/drain regions 150 are formed on both sides of the first gate electrode 130. The source/drain regions 150 are formed on the fin-type pattern 110. The source/drain regions 150 are connected to the first wire pattern 120 which is a channel region.

The source/drain regions 150 may include an epitaxial layer 155 formed on the top surface of the fin-type pattern 110. In a semiconductor device according to an embodiment of the present inventive concept, the epitaxial layer 155 may be formed only on the lower pattern 112 of the fin-type pattern 110.

The source/drain regions 150 are formed on the lower pattern 112 but not on the first upper pattern 115. In other words, bottom surfaces of the source/drain regions 150 do not overlap the first upper pattern 115.

An outer circumferential surface of the epitaxial layer 155 may have various shapes. For example, the outer circumferential surface of the epitaxial layer 155 may have at least one of a diamond shape, a circular shape, and a rectangular shape. In FIG. 3, the outer circumferential surface of the epitaxial layer 155 has a diamond shape (or a pentagonal shape or a hexagonal shape).

The epitaxial layer 155 may include a first portion 155a and a second portion 155b. The first wire pattern 120 is located between the first portions 155a of the epitaxial layer 155 on both sides of the first gate electrode 130 but is not located between the second portions 155b of the epitaxial layer 155 on both sides of the first gate electrode 130.

The gate insulating layer 145 which surrounds the first wire pattern 120, and the first gate electrode 130 are disposed between the second portions 155b of the epitaxial layer 155 on both sides of the first gate electrode 130.

If the semiconductor device 1 according to the first embodiment of the present inventive concept is a PMOS transistor, the epitaxial layer 155 may include a compressive stress material. The compressive stress material may be a material (e.g., SiGe) having a greater lattice constant than Si. The compressive stress material may improve the mobility of carriers in a channel region by applying compressive stress to the first wire pattern 120.

If the semiconductor device 1 is an NMOS transistor, the epitaxial layer 155 may be formed of the same material as the first wire pattern 120 or a tensile stress material. For example, if the first wire pattern 120 is Si, the epitaxial layer 155 may be Si or a material (e.g., SiC) having a smaller lattice constant than Si.

In FIGS. 1 through 5, one first wire pattern 120 is illustrated. However, this is merely an example used for ease of description, and the number of first wire patterns 120 is not limited to one.

In FIGS. 1 through 2B, a plurality of gate electrodes is formed on one fin-type pattern. However, the present inventive concept is not limited thereto. That is, only one gate electrode can be formed on one fin-type pattern.

The effect of the first upper pattern 115 (i.e., the insulating layer pattern) will now be described.

Without the first upper pattern 115, a channel region between the source/drain regions 150 can be the top surface of the fin-type pattern 110 as well as the first wire pattern 120. This is because the gate insulating layer 145 and the first gate electrode 130 are also formed on the top surface of the fin-type pattern 110.

In other words, if the top surface of the fin-type pattern 110 between the source/drain regions 150 is used as a channel region, short-channel characteristics of a transistor deteriorate.

As in the present inventive concept, however, if the first upper pattern 115 is formed on the top surface of the fin-type pattern 110 that can be used as a channel region, the top surface of the fin-type pattern 110 cannot be used as the channel region due to the first upper pattern 115.

Specifically, when the gate insulating layer 145 and the first gate electrode 130 are formed on the first upper pattern 115, the first upper pattern 115 formed of an insulating material is located in a channel region through which electric charges can move between the source/drain regions 150. Therefore, no channel region is formed along the top surface of the fin-type pattern 110.

A channel region can also be formed between the first upper pattern 115 and the lower pattern 112. However, the thick first upper pattern 115 requires a very high threshold voltage to form the channel region between the first upper pattern 115 and the lower pattern 112. Therefore, no channel region can be formed between the first upper pattern 115 and the lower pattern 112 with an operating voltage used to form a channel region in the first wire pattern 120.

Figure 6:
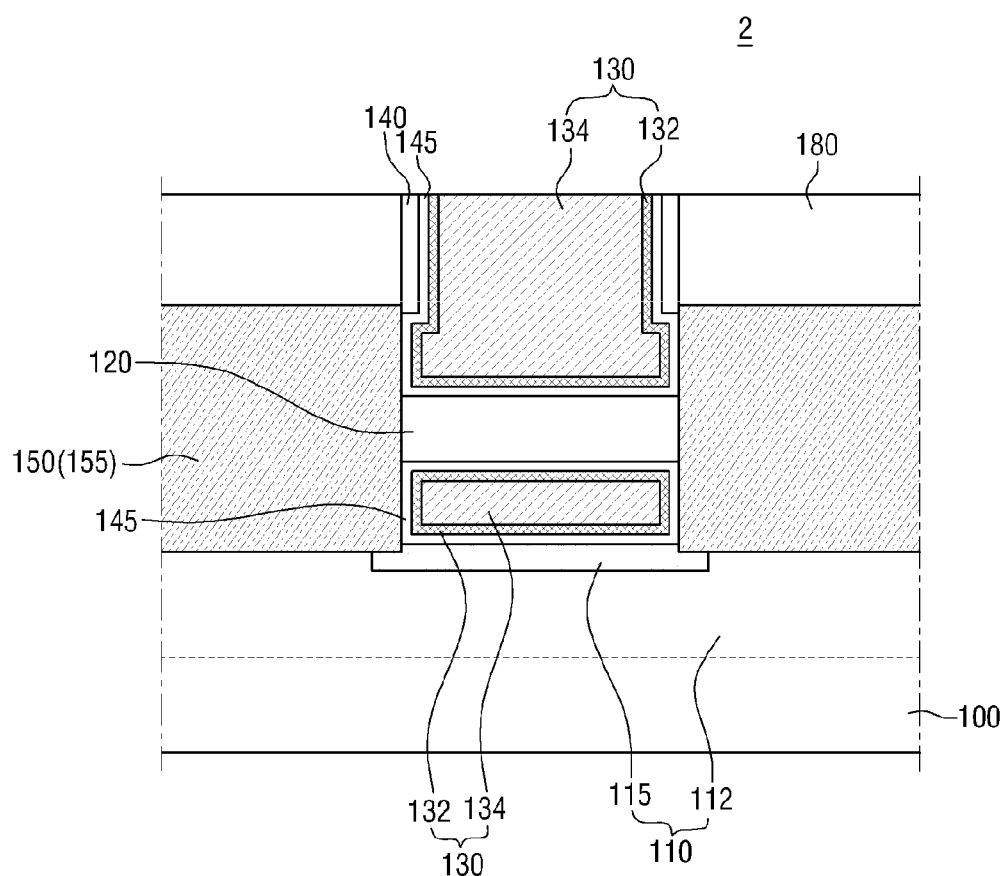
FIG. 6 is a cross-sectional view of a semiconductor device according to an example embodiment.

FIG. 6 is a cross-sectional view of a semiconductor device 2 according to a second embodiment of the present inventive concept. For simplicity, the semiconductor device 2 according to the second embodiment will hereinafter be described, focusing mainly on differences with the semiconductor device 1 according to the first embodiment of the present inventive concept.

Referring to FIG. 6, in the semiconductor device 2 according to the second embodiment of the present inventive concept, a portion of each of source/drain regions 150 is disposed on a first upper pattern 115.

The portion of each of the source/drain regions 150 overlaps the first upper pattern 115 in a direction in which a first wire pattern 120 extends. In other words, the first upper pattern 115 extends along a portion of a bottom surface of each of the source/drain regions 150.

Referring also to FIG. 2B, in the semiconductor device 2 according to the second embodiment of the present inventive concept, the first upper pattern 115 may be formed over the whole of a second portion 112b of a lower pattern 112 and part of a first portion 112a of the lower pattern 112.

In FIG. 6, a top surface of the first upper pattern 115 is substantially co-planar with a top surface of the lower pattern 112 at a boundary between the source/drain regions 150 and a fin-type pattern 110. However, this is merely an example used for ease of description, and the present inventive concept is not limited to this example. That is, the top surface of the first upper pattern 115 may protrude further upward than the top surface of the lower pattern 112 at the boundary between the source/drain regions 150 and the fin-type pattern 110.

Figure 7:
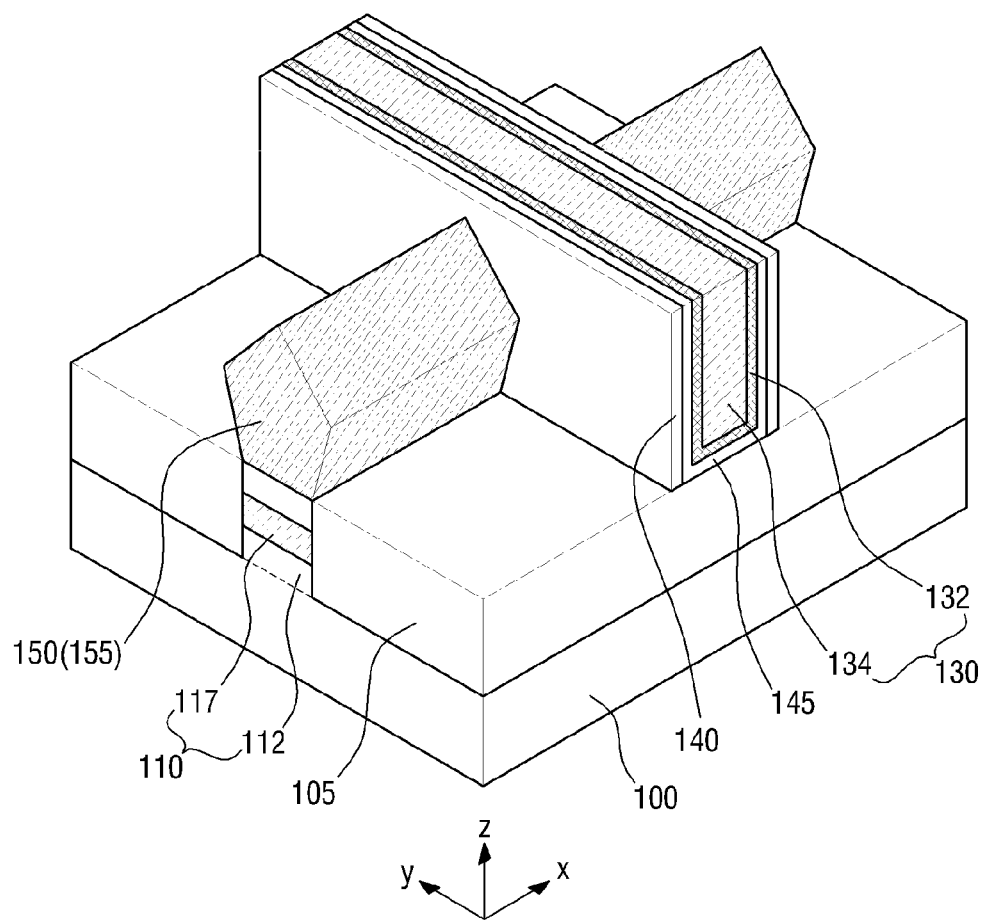
FIGS. 7 and 8 are views of a semiconductor device according to an example embodiment.
Figure 8:
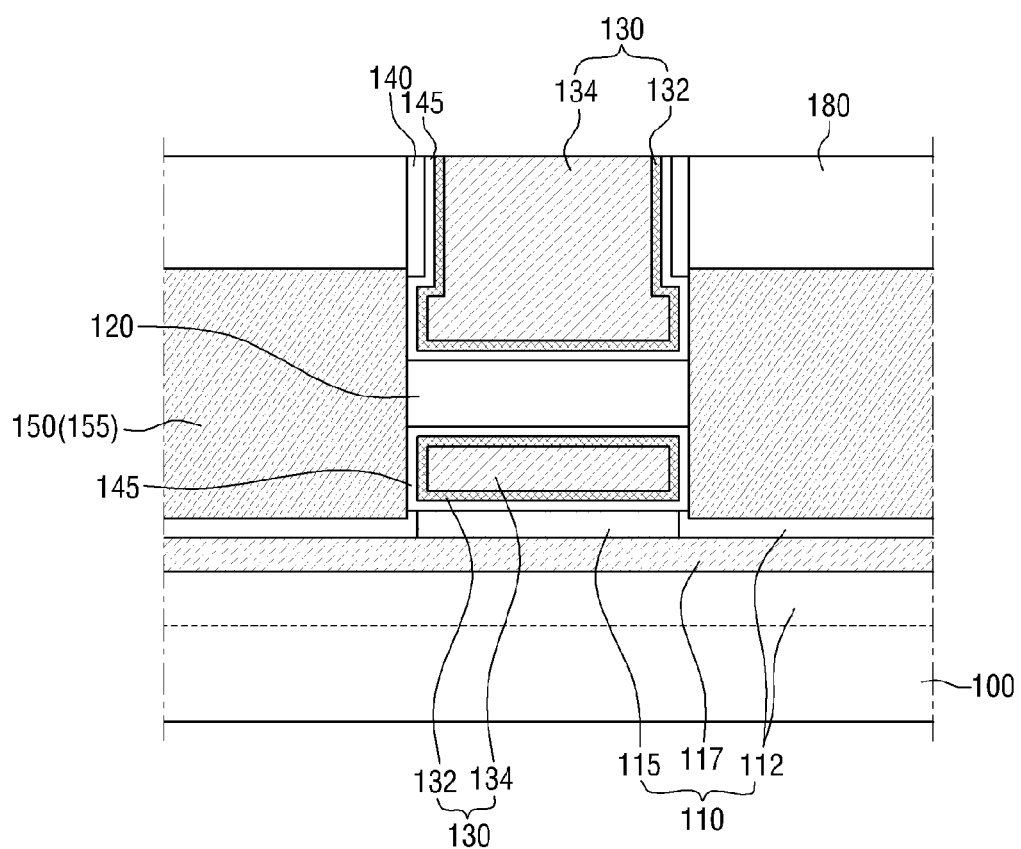

FIGS. 7 and 8 are views of a semiconductor device 3 according to a third embodiment of the present inventive concept. For simplicity, the semiconductor device 3 according to the third embodiment will hereinafter be described, focusing mainly on differences with the semiconductor device 1 according to the first embodiment of the present inventive concept.

Referring to FIGS. 7 and 8, a fin-type pattern 110 may further include an insertion pattern 117.

The insertion pattern 117 may be formed under a first upper pattern 115. In other words, a lower pattern 112 may be located under the insertion pattern 117, and the first upper pattern 115 and a portion of the lower pattern 112 may be located on the insertion pattern 117.

The insertion pattern 117 may include a different material from that of the lower pattern 112. A lattice constant of the material included in the insertion pattern 117 may be different from that of the material included in the lower pattern 112.

The insertion pattern 117 may include a material having an etch selectivity with respect to the lower pattern 112. For example, the lower pattern 112 may include silicon, and the insertion pattern 117 may include silicon germanium (SiGe).

In addition, the lower pattern 112 located under the insertion pattern 117 may be a pattern formed by partially etching a substrate 100, and the lower pattern 112 located on the insertion pattern 117 may be a pattern formed by etching an epitaxial film formed on the insertion pattern 117.

Figure 9:
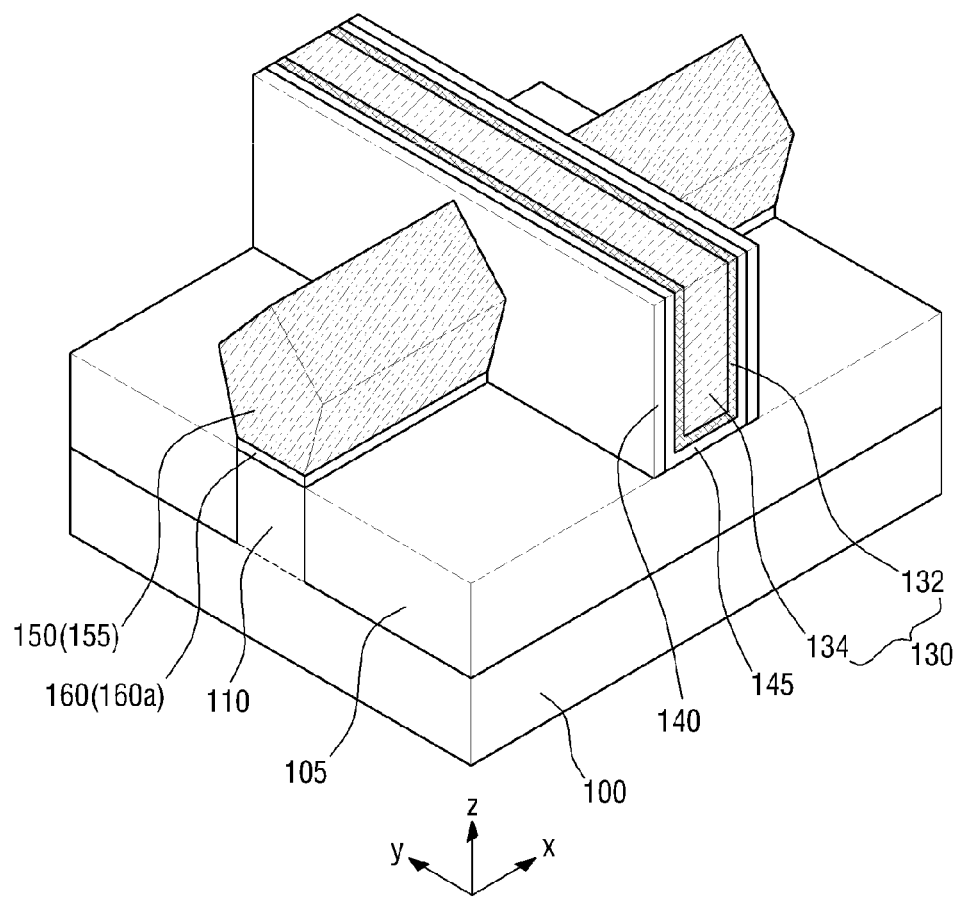
FIGS. 9 and 10 are views of a semiconductor device according to an example embodiment.
Figure 10:
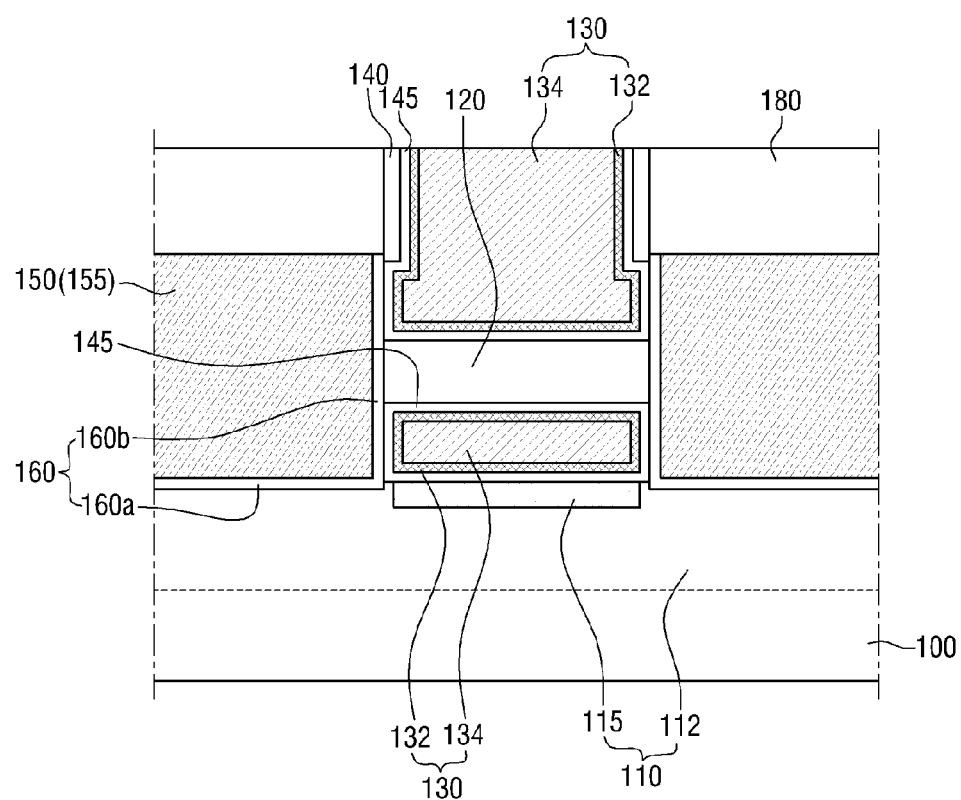

FIGS. 9 and 10 are views of a semiconductor device 4 according to a fourth embodiment of the present inventive concept. For simplicity, the semiconductor device 4 according to the fourth embodiment will hereinafter be described, focusing mainly on differences with the semiconductor device 1 according to the first embodiment of the present inventive concept.

Referring to FIGS. 9 and 10, the semiconductor device 4 according to the fourth embodiment of the present inventive concept may further include a first epitaxial seed film 160.

The first epitaxial seed film 160 includes a first portion 160a and a second portion 160b. The first portion 160a of the first epitaxial seed film 160 and the second portion 160b of the first epitaxial seed film 160 are directly connected to each other.

The first portion 160a of the first epitaxial seed film 160 is formed between each of source/drain regions 150 and a fin-type pattern 110. That is, the first portion 160a of the first epitaxial film 160 is located between a bottom surface of each of the source/drain regions 150 and a top surface of the fin-type pattern 110.

The second portion 160b of the first epitaxial seed film 160 is located between each of the source/drain regions 150 and a first wire pattern 120 and between each of the source/drain regions 150 and a first gate electrode 130.

In a fabrication process, the first epitaxial seed film 160 may be an epitaxial film formed on the top surface of the fin-type pattern 110 and a cross section of the first wire pattern 120 prior to the formation of an epitaxial layer 155. For example, the first epitaxial seed film 160 may prevent the grown epitaxial layer 155 from being etched and thus lost in a process of fabricating the first wire pattern 120.

The first epitaxial seed film 160 may include a material different from a material of the epitaxial layer 155. For example, if the epitaxial layer 155 includes silicon germanium, the first epitaxial seed film 160 may include silicon.

In FIG. 10, the first epitaxial seed film 160 includes the first portion 160a formed between each of the source/drain regions 150 and the fin-type pattern 110 and the second portion 160b formed between each of the source/drain regions 150 and the first wire pattern 120. However, the present inventive concept is not limited thereto.

Figure 11:
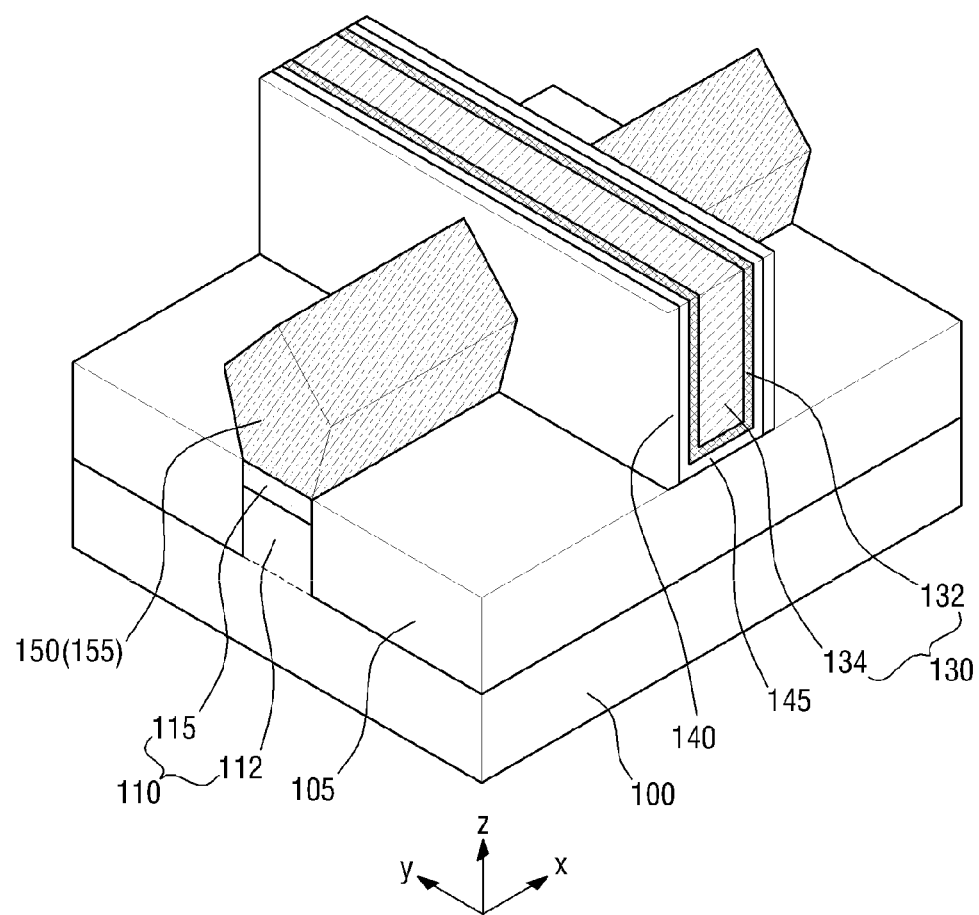
FIGS. 11 and 12 are views of a semiconductor device according to an example embodiment.
Figure 12:
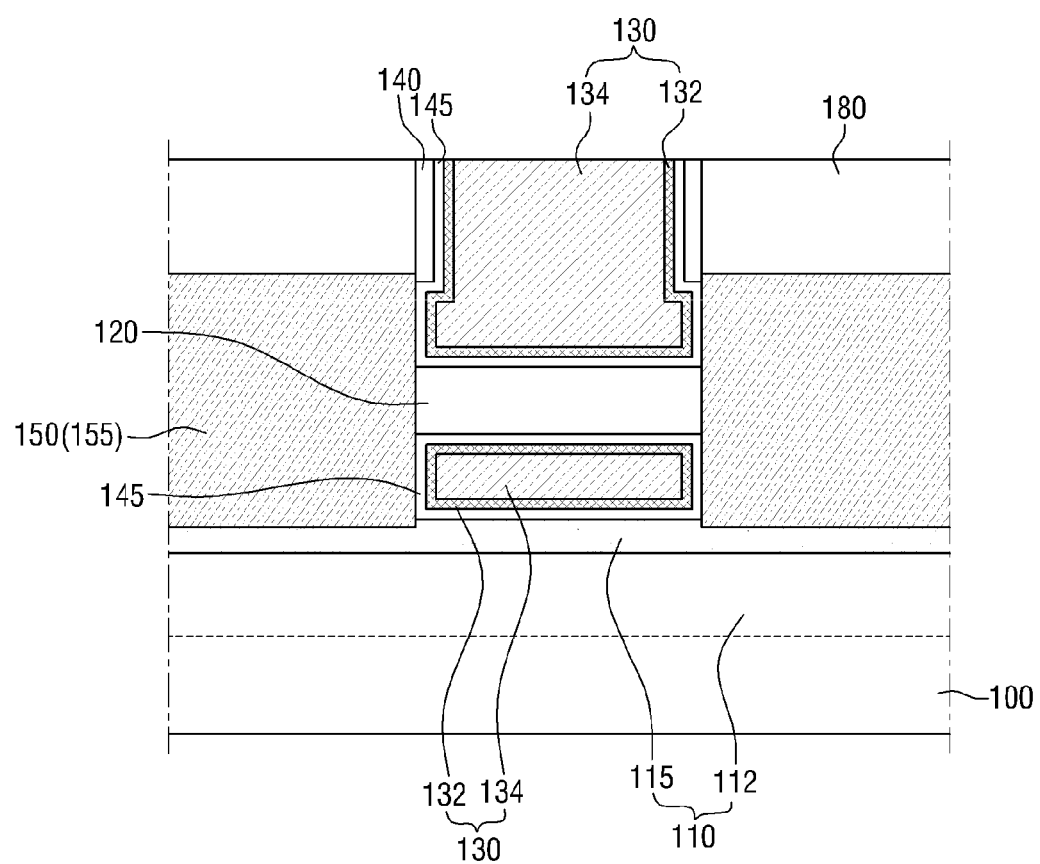

If the whole source/drain regions 150 are disposed on an insulating layer pattern as illustrated in FIGS. 11 and 12 which will be described later, the first epitaxial seed film 160 may include only the second portion 160b formed between each of the source/drain regions 150 and the first wire pattern 12Q and between each of the source/drain regions 150 and the first gate electrode 130.

In FIG. 10, the second portion 160b of the first epitaxial seed film 160 extends between each of the source/drain regions 150 and a gate spacer 140. However, this is merely an example used for ease of description, and the present inventive concept is not limited to this example.

FIGS. 11 and 12 are views of a semiconductor device 5 according to a fifth embodiment of the present inventive concept. For simplicity, the semiconductor device 5 according to the fifth embodiment will hereinafter be described, focusing mainly on differences with the semiconductor device 1 according to the first embodiment of the present inventive concept.

Referring to FIGS. 11 and 12, in the semiconductor device 5 according to the fifth embodiment of the present inventive concept, the whole source/drain regions 150 are disposed on a first upper pattern 115. That is, the whole source/drain regions 150 are formed on the first upper pattern 115.

The whole bottom surface of each of the source/drain regions 150 overlaps the first upper pattern 115. In other words, the first upper pattern 115 extends along the whole bottom surface of each of the source/drain regions 150.

Referring also to FIG. 2B, in the semiconductor device 5 according to the fifth embodiment of the present inventive concept, the first upper pattern 115 may be formed over the whole second portion 112b of a lower pattern 112 and the whole first portion 112a of the lower pattern 112. That is, the whole top surface of a fin-type pattern 110 may be a top surface of the first upper pattern 115 and a top surface of a second upper pattern 116.

In FIG. 12, the fin-type pattern 110 is formed on a substrate 100 and protrudes from the substrate 100. The fin-type pattern 110 includes the lower pattern 112 and the first upper pattern 115 stacked sequentially. That is, the fin-type pattern 110 includes a semiconductor pattern and an insulating layer pattern stacked sequentially. A first wire pattern 120 is formed on this fin-type pattern 110 to be separated from the first upper pattern 115. In addition, the source/drain regions 150, that is, an epitaxial layer 155 is formed on the first upper pattern 115 (i.e., the insulating layer pattern) on both sides of each of the first wire pattern 120 and the first gate electrode 130.

In the semiconductor device 5 according to the fifth embodiment of the present inventive concept, the source/drain regions 150 contact the first upper pattern 115. In other words, the epitaxial layer 155 (i.e., the insulating layer pattern) is formed directly on the first upper pattern 115, and the first upper pattern 115 contacts the epitaxial layer 155.

In FIG. 12, there is a step between the top surface of the first upper pattern 115 under each of the source/drain regions 150 and the top surface of the first upper pattern 115 under the first wire pattern 120. However, this is merely an example used for ease of description, and the present inventive concept is not limited to this example.

Figure 13:
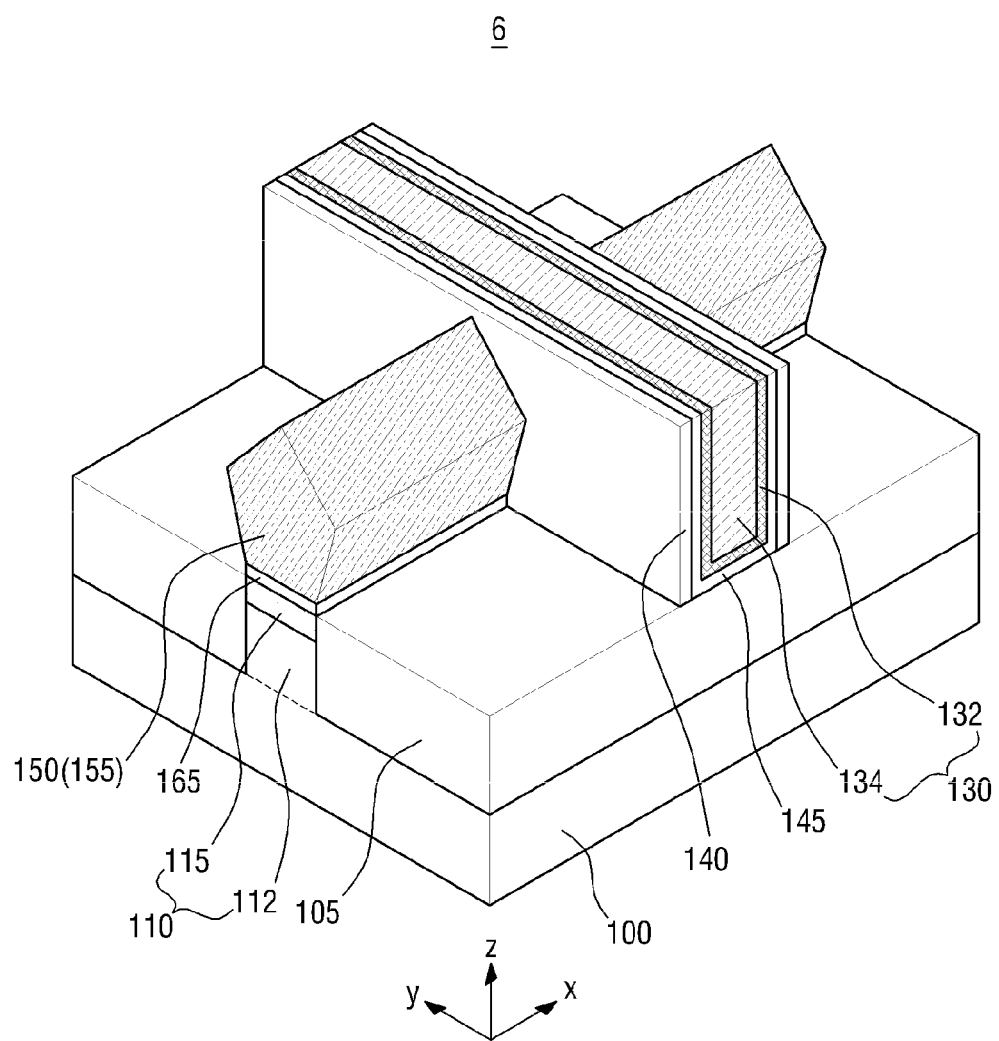
FIGS. 13 and 14 are views of a semiconductor device according to an example embodiment.
Figure 14:
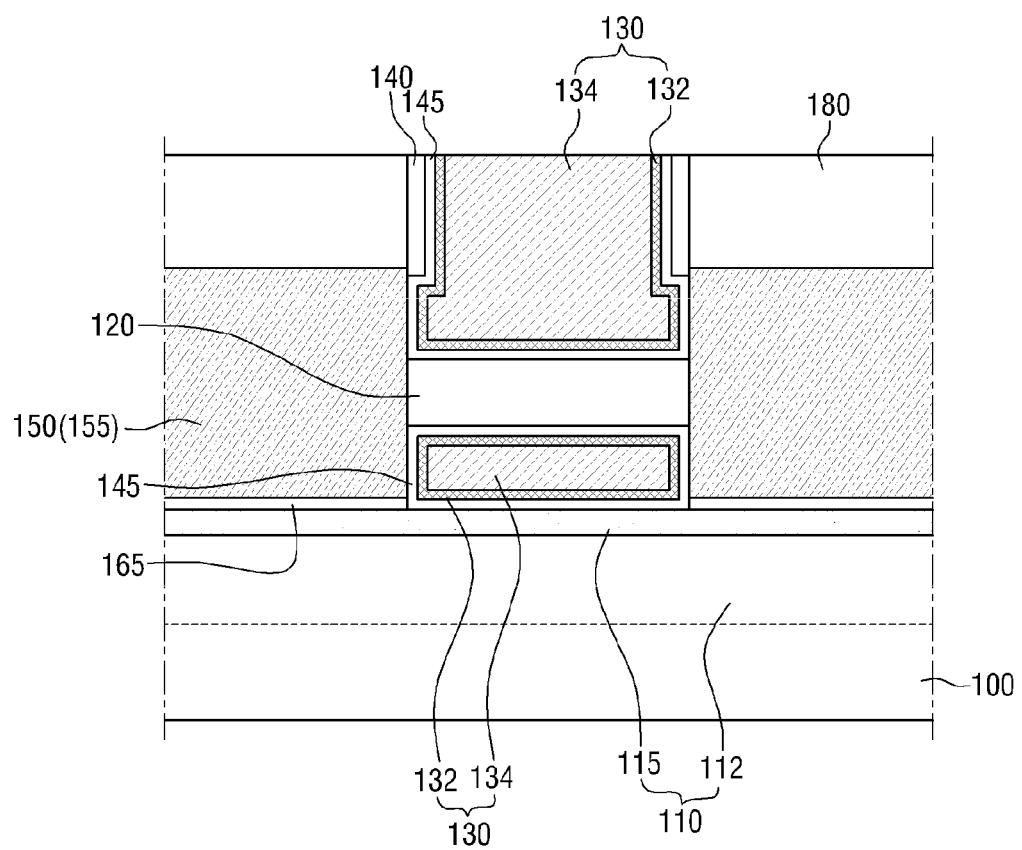

FIGS. 13 and 14 are views of a semiconductor device 6 according to a sixth embodiment of the present inventive concept. For simplicity, the semiconductor device 6 according to the sixth embodiment will hereinafter be described, focusing mainly on differences with the semiconductor device 5 according to the fifth embodiment of the present inventive concept.

Referring to FIGS. 13 and 14, the semiconductor device 6 according to the sixth embodiment of the present inventive concept may further include a second epitaxial seed film 165.

The second epitaxial seed film 165 is formed between each of source/drain regions 15Q and a fin-type pattern 110. The second epitaxial seed film 165 is located between a bottom surface of each of the source/drain regions 150 and a top surface of the fin-type pattern 110.

The second epitaxial seed film 165 is formed on a first upper pattern 115. The second epitaxial seed film 165 is located on the first upper pattern 115 (i.e., an insulating layer pattern) to enable an epitaxial layer 155 to be epitaxially grown on the first upper pattern 115. Therefore, the second epitaxial seed film 165 may be formed between each of the source/drain regions 150 and the first upper pattern 115.

The second epitaxial seed film 165 and a first wire pattern 120 may include different materials. For example, if the first wire pattern 120 includes silicon, the second epitaxial seed film 165 may include silicon germanium.

In a fabrication process, the second epitaxial seed film 165 may be an epitaxial film formed on the top surface of the fin-type pattern 110 prior to the formation of an epitaxial layer 155.

Figure 15:
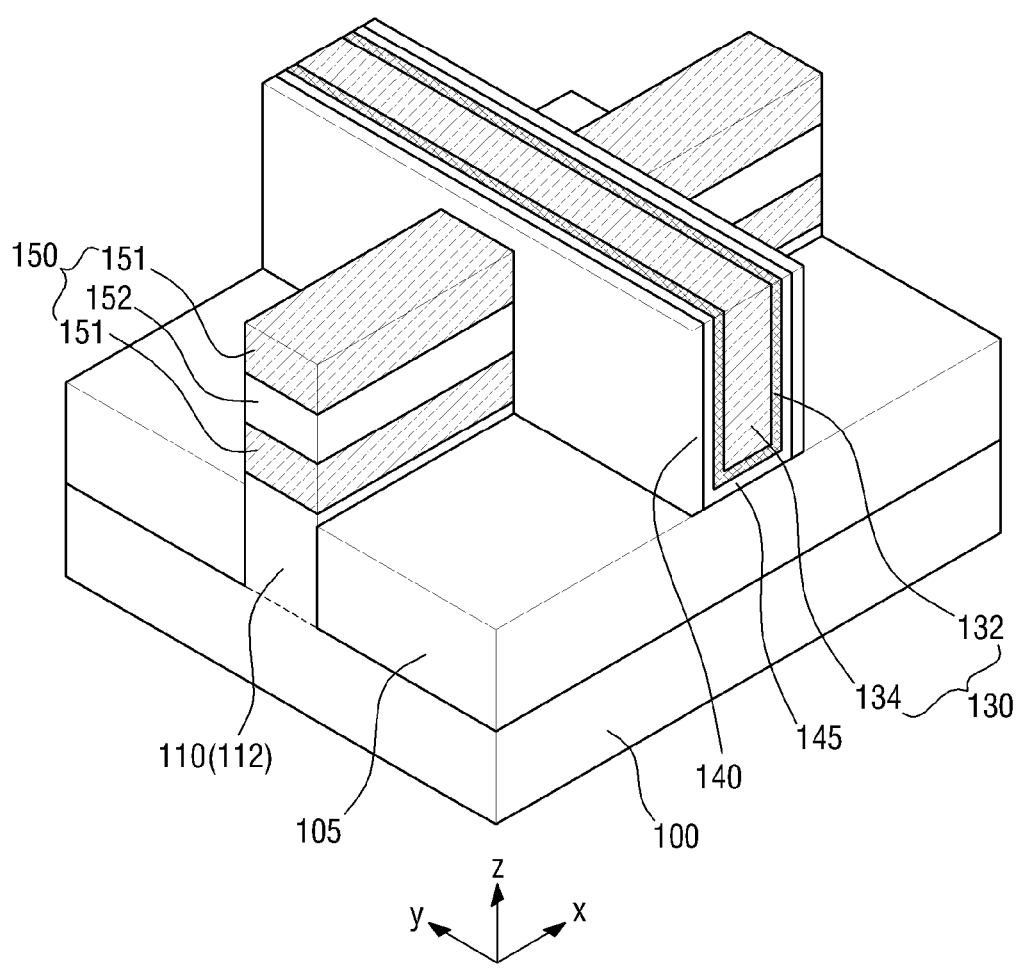
FIGS. 15 and 16 are views of a semiconductor device according to an example embodiment.
Figure 16:
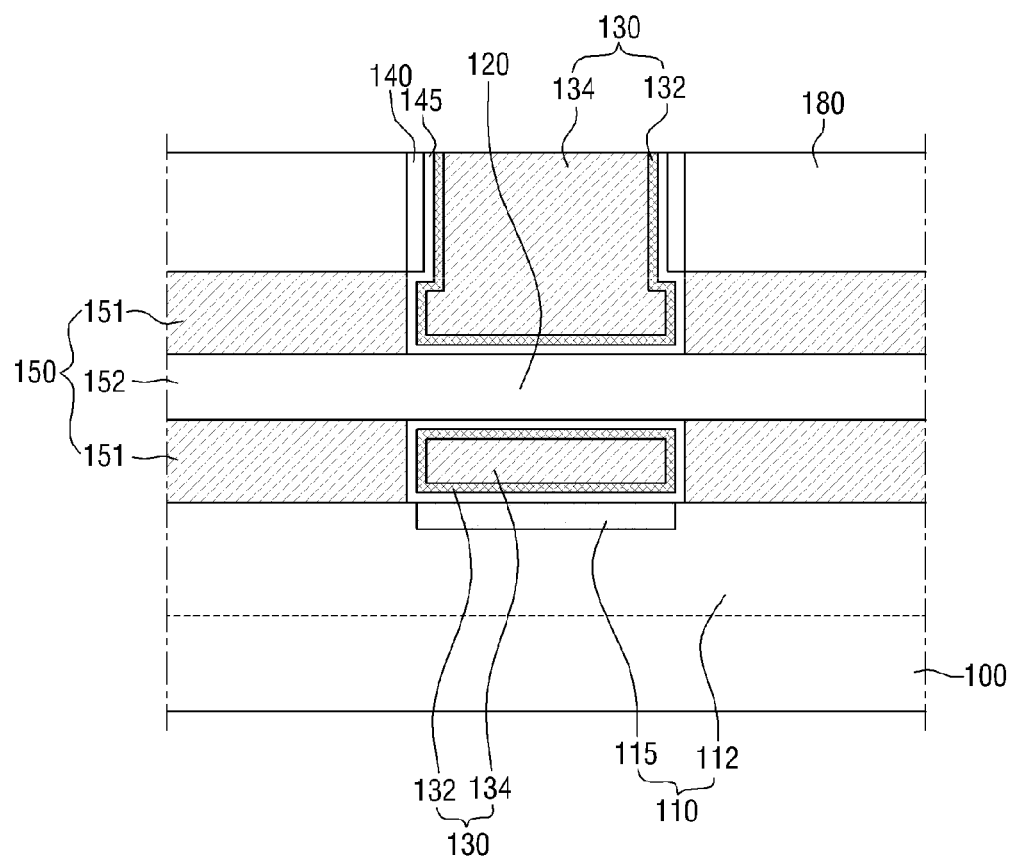

FIGS. 15 and 16 are views of a semiconductor device 7 according to a seventh embodiment of the present inventive concept. For simplicity, the semiconductor device 4 according to the fourth embodiment will hereinafter be described, focusing mainly on differences with the semiconductor device 1 according to the first embodiment of the present inventive concept.

Referring to FIGS. 15 and 16, each of source/drain regions 150 includes a first semiconductor pattern 151 and a second semiconductor pattern 152 stacked sequentially on a top surface of a fin-type pattern 110. A top surface of each of the source/drain regions 150 may be a top surface of the first semiconductor pattern 151.

A width of each of the source/drain regions 150 in a second direction Y may be substantially equal to a width of the fin-type pattern 110 in the second direction Y.

The second semiconductor pattern 152 is directly connected to a first wire pattern 120. Specifically, the second semiconductor pattern 152 may be an extended portion of the first wire pattern 120. In addition, the second semiconductor pattern 152 may be formed at the same level as the first wire pattern 120. Here, the term "the same level" denotes that the second semiconductor pattern 152 and the first wire pattern 120 are formed by the same fabrication process.

The first semiconductor pattern 151 may be formed on and under the second semiconductor pattern 152. The first semiconductor pattern 151 may be disposed on both sides of a first gate electrode 130 in a first direction X. That is, the first gate electrode 130 may be disposed between the first semiconductor patterns 151.

The first semiconductor pattern 151 and the second semiconductor pattern 152 may include different materials each other. The first semiconductor pattern 151 may include a material having an etch selectivity with respect to the second semiconductor pattern 152. For example, the second semiconductor pattern 152 may include silicon, and the first semiconductor pattern 151 may include silicon germanium.

In FIG. 16, a thickness of the first wire pattern 120 and are equal to a thickness of the second semiconductor pattern 152. However, this is merely an example used for ease of description, and the present inventive concept is not limited to this example.

A method of fabricating a semiconductor device according to an embodiment of the present inventive concept will now be described with reference to FIGS. 17 through, 24A, 24B, 24C, 25A, 25B, 26, 27A and 27B. A semiconductor device fabricated using the method of FIGS. 17 through 27B is the semiconductor device 5 described above with reference to FIG. 5.

Figure 25A:
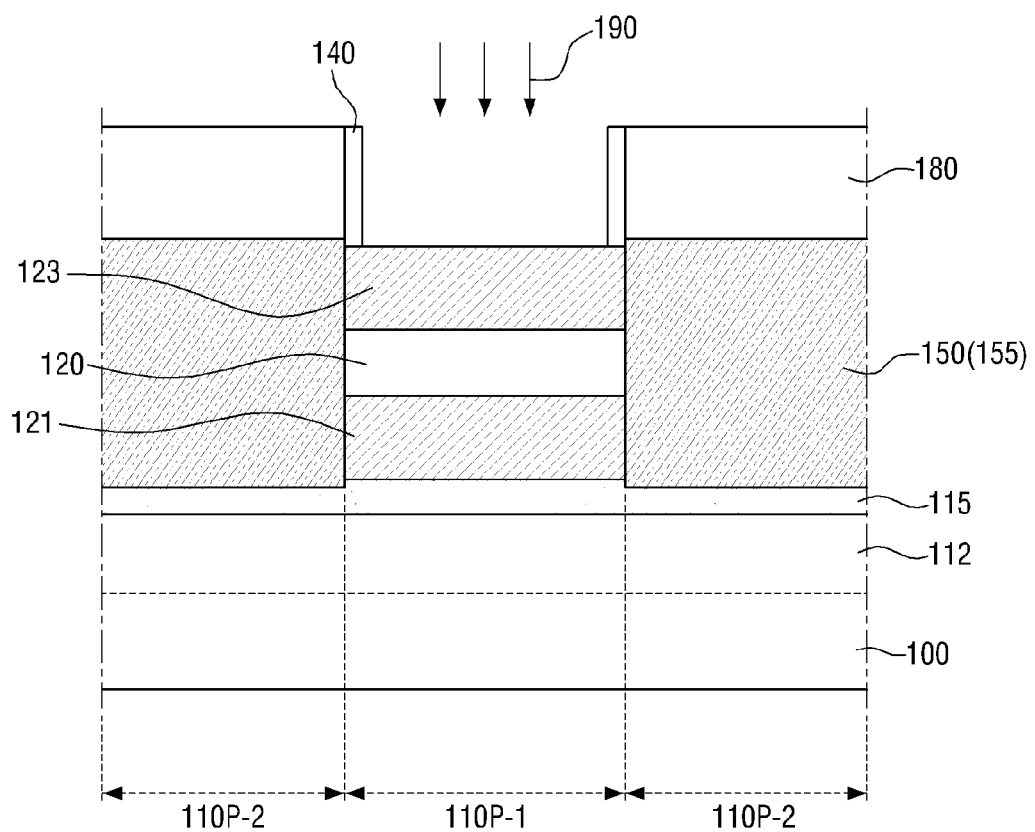
Figure 25B:
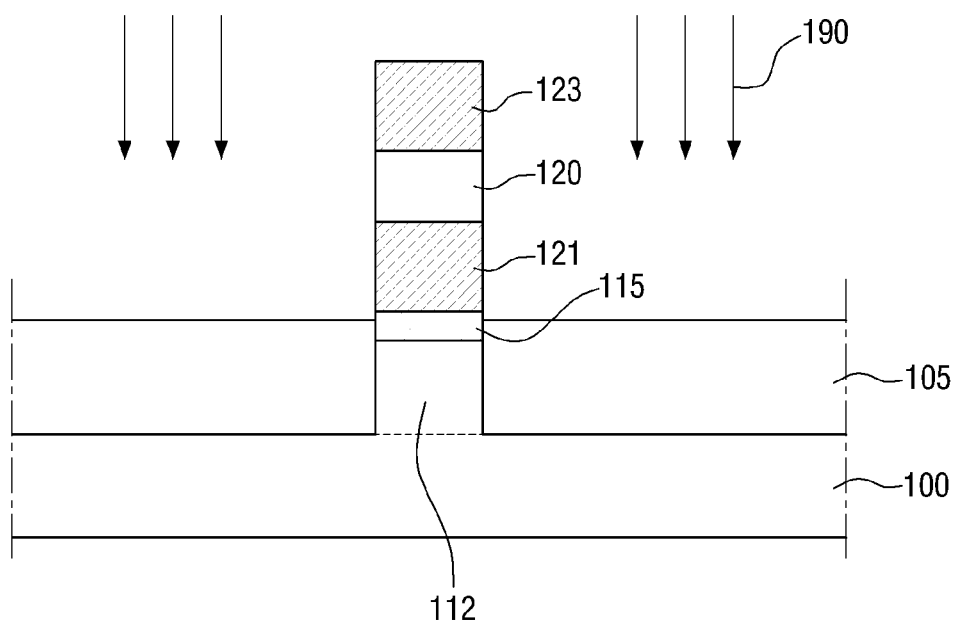
Figure 26:
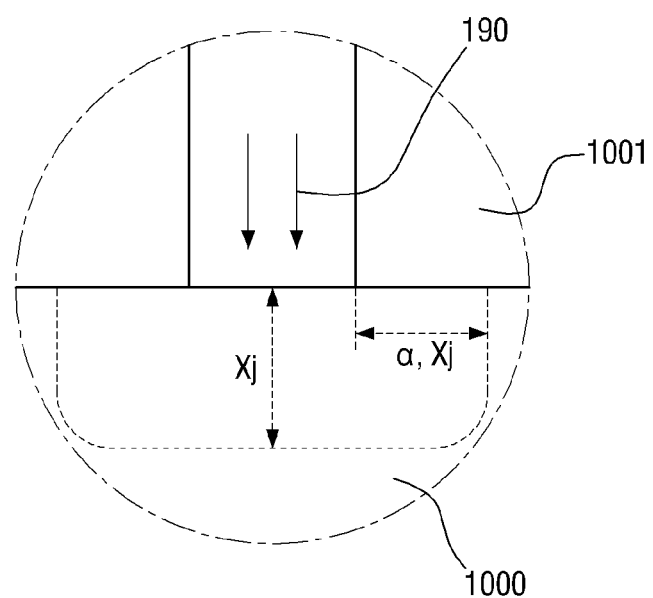

FIGS. 17 through 27B are views illustrating steps of a method of fabricating a semiconductor device according to an embodiment of the present inventive concept. Specifically, FIG. 24B is a cross-sectional view taken along the line D-D of FIG. 24A, and FIG. 24C is a cross-sectional view taken along the line E-E of FIG. 24A. FIG. 26 is a view illustrating the diffusion of injected impurities in a lateral direction during a directional impurity doping process.

Figure 17:
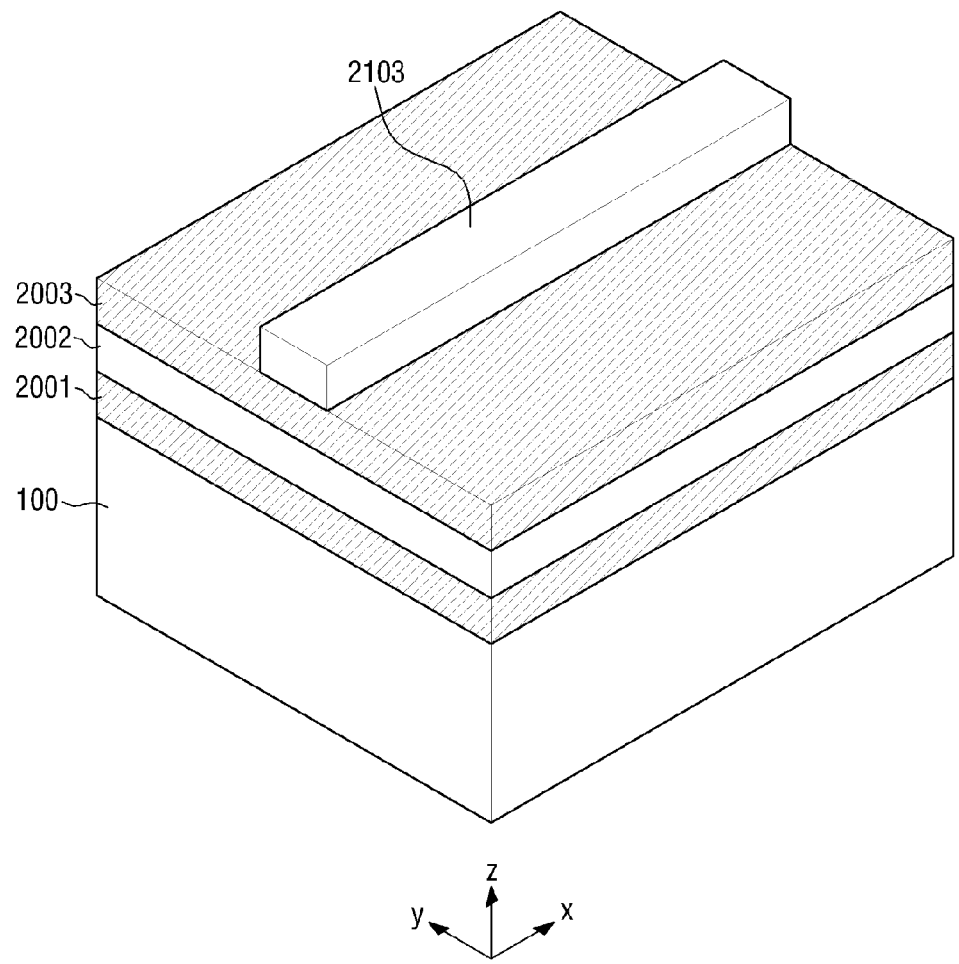
FIGS. 17 through 23, 24A, 24B, 24C, 25A, 25B, 26, 27A and 27B are views illustrating steps of a method of fabricating a semiconductor device according to an example embodiment.

Referring to FIG. 17, a first sacrificial layer 2001, an active layer 2002, a second sacrificial layer 2003 are formed sequentially on a substrate 100.

The first sacrificial layer 2001, the active layer 2002, and the second sacrificial layer 2003 may be formed using, e.g., an epitaxial growth method.

The first sacrificial layer 2001 and the second sacrificial layer 2003 may include the same material, and the first sacrificial layer 2001 and the active layer 2002 may include different materials. In addition, the active layer 2002 may include a material having an etch selectivity with respect to the first sacrificial layer 2001.

For example, the substrate 100 and the active layer 2002 may include silicon, and the first sacrificial layer 2001 and the second sacrificial layer 2003 may include silicon germanium.

In FIG. 17, one active layer 2002 is illustrated. However, this is merely an example used for ease of description, and the present inventive concept is not limited to this example. That is, the first sacrificial layer 2001 and the active layer 2002 may be formed alternatively to form a plurality of pairs, and the second sacrificial layer 2003 may be formed on the topmost active layer 2002.

A first mask pattern 2103 is formed on the second sacrificial layer 2003. The first mask pattern 2103 may extend along a first direction X.

The first mask pattern 2103 may be formed of a material including at least one of a silicon oxide layer, a silicon nitride layer, and a silicon oxynitride layer.

Figure 18:
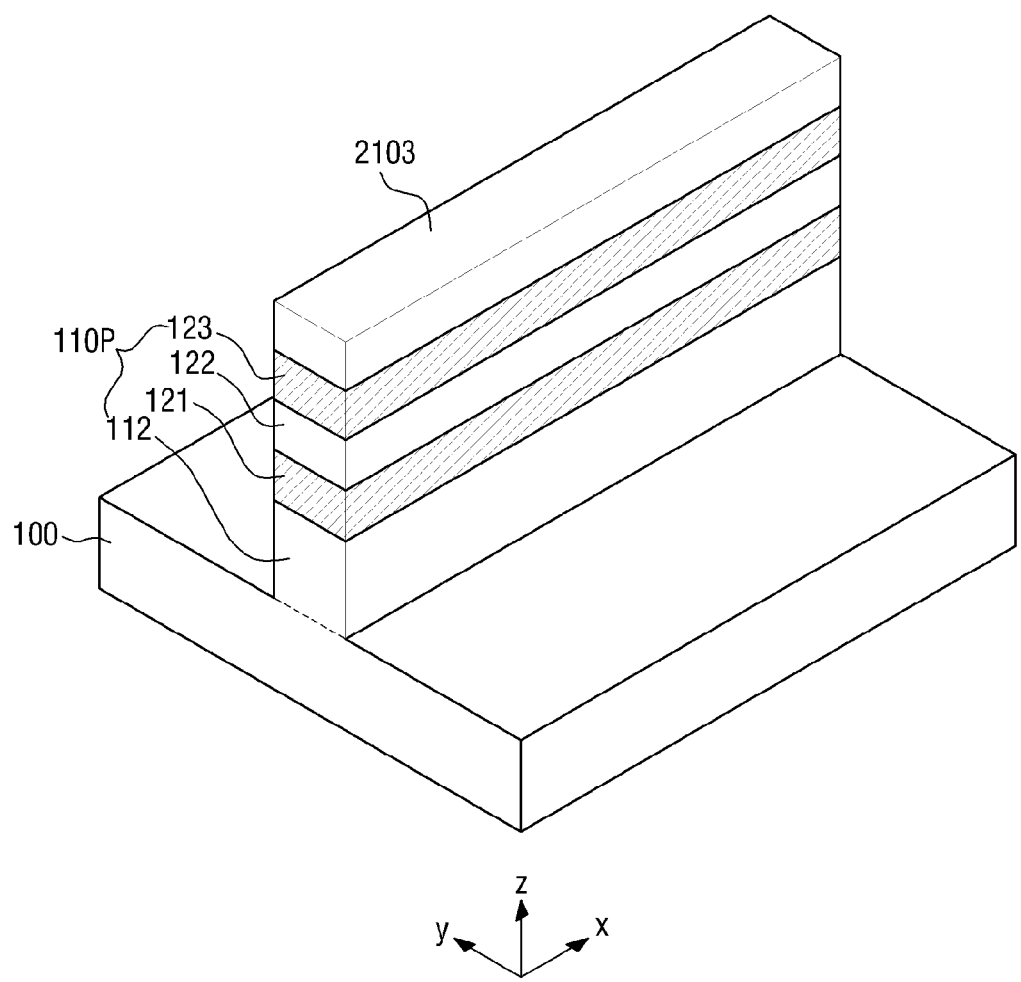

Referring to FIG. 18, an etching process is performed using the first mask pattern 2103 as an etch mask, thereby forming a fin-type structure 110p.

The fin-type structure 110p may be formed by patterning the second sacrificial layer 2003, the active layer 2002, the first sacrificial layer 2001, and part of the substrate 100.

The fin-type structure 110p is formed on the substrate 100 and protrudes from the substrate 100. Like the first mask pattern 2103, the fin-type structure 110p may extend along the first direction X.

The fin-type structure 110p includes a lower pattern 112, a first sacrificial pattern 121, a pre-wire pattern 122, and a second sacrificial pattern 123 stacked sequentially on the substrate 100. Here, the lower pattern 112 may be a semiconductor pattern.

Figure 19:
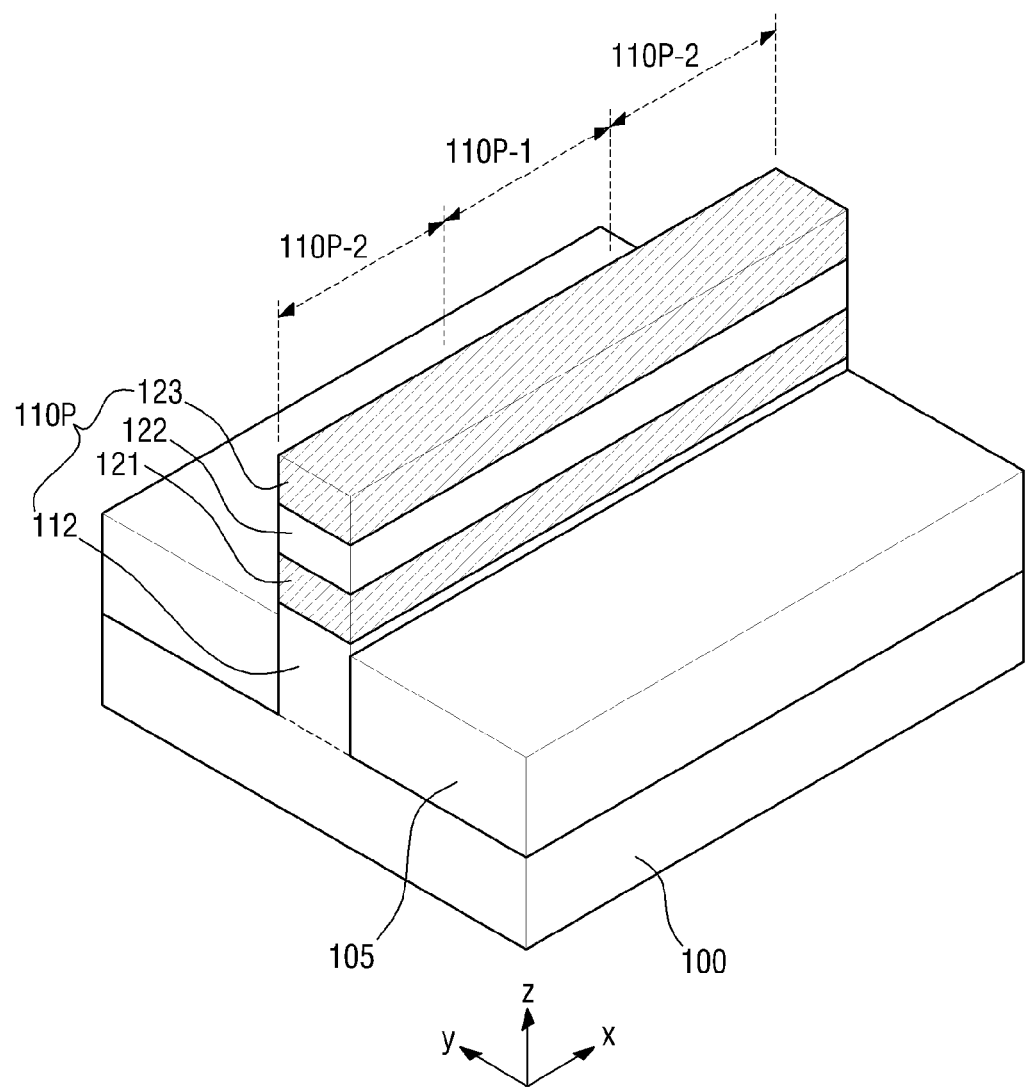

Referring to FIG. 19, a field insulating layer 105 is formed on the substrate 100 to cover at least a part of sidewalls of the fin-type structure 110p.

Specifically, the field insulating layer 105 is formed on the substrate 10 to cover the fin-type structure 110p. Then, the field insulating layer 105 is planarized such that a top surface of the fin-type structure 110p lies in the same plane with a top surface of the field insulating layer 105.

In the planarization process, the first mask pattern 2103 may be removed, but the present inventive concept is not limited thereto.

An upper portion of the field insulating layer 105 is recessed to partially expose the fin-type structure 110p. The recess process may include a selective etching process. That is, the fin-type structure 110p is formed to protrude from the field insulating layer 105.

In FIG. 19, the second sacrificial pattern 123, the pre-wire pattern 122, the first sacrificial pattern 121, and a portion of the lower pattern 112 protrude upward from a top surface of the field insulating layer 105, and the other portion of the lower pattern 112 is surrounded by the field insulating layer 105. However, the present inventive concept is not limited thereto. That is, the upper portion of the field insulating layer 105 can be recessed such that at least a part of the first sacrificial pattern 121 protrudes from the top surface of the field insulating layer 105.

A doping process for controlling a threshold voltage may be performed on the pre-wire pattern 122 before and/or after the recess process for making a portion of the fin-type structure 110p protrude further upward than the top surface of the field insulating layer 105. If each of the semiconductor devices 1 through 7 is an n-channel metal oxide semiconductor (NMOS) transistor, impurities used in the doping process may be boron (B). If each of the semiconductor devices 1 through 7 is a p-channel metal oxide semiconductor (PMOS) transistor, the impurities may be phosphorous (P) or arsenic (As).

In addition, the fin-type structure 110p protruding upward from the top surface of the field insulating layer 105 may include a first portion 110p-1 and second portions 110p-2. The second portions 110p-2 of the fin-type structure 110p may be located on both sides of the first portion 110p-1 of the fin-type structure 110p in the first direction X.

Figure 20:
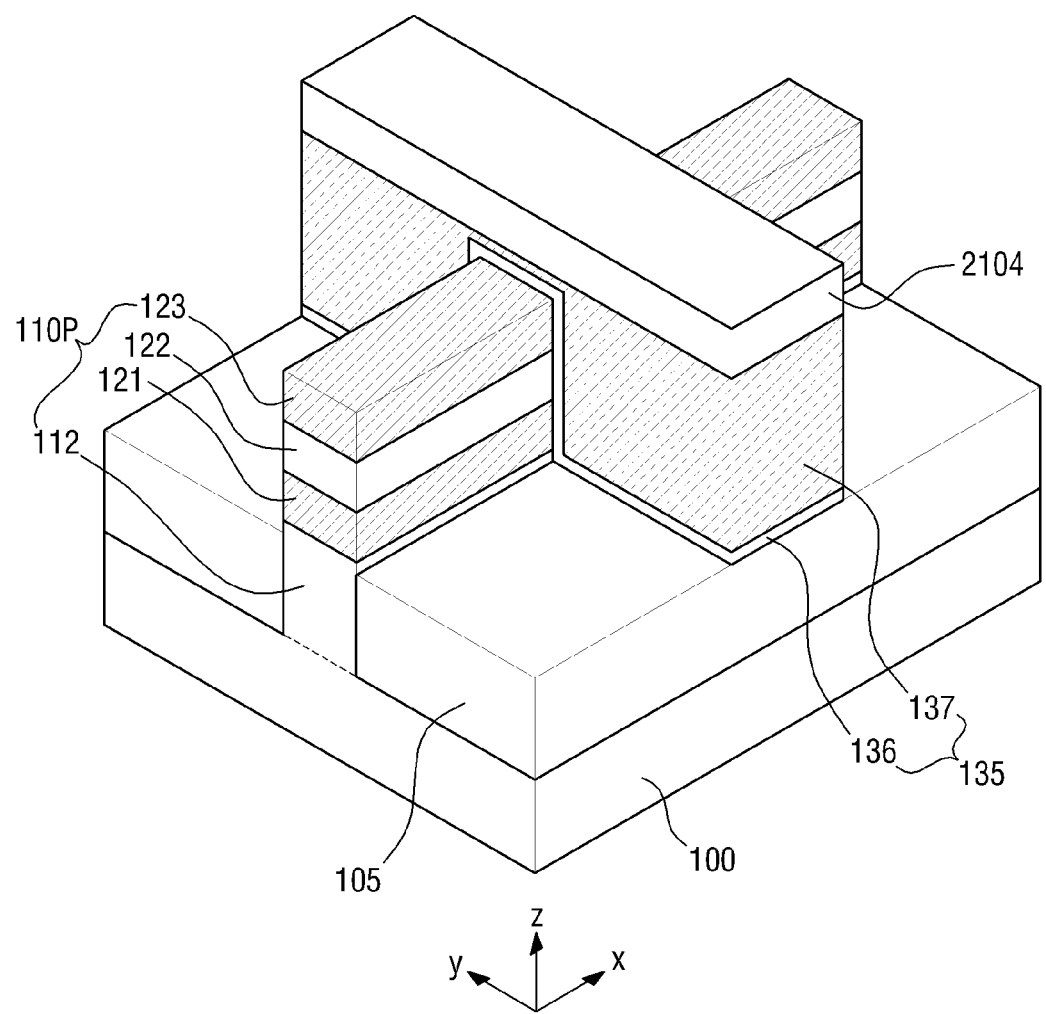

Referring to FIG. 20, an etching process is performed using a second mask pattern 2104 as an etch mask, thereby forming a dummy gate pattern 135 which extends along a second direction Y to intersect the fin-type structure 110p.

Accordingly, the dummy gate pattern 135 is formed on the fin-type structure 110p. More specifically, the dummy gate pattern 135 is formed on a first portion 110p-1 of the fin-type structure 110p.

The dummy gate pattern 135 includes a dummy gate insulating layer 136 and a dummy gate electrode 137. For example, the dummy gate insulating layer 136 may be a silicon oxide layer, and the dummy gate electrode 137 may be polysilicon.

Figure 21:
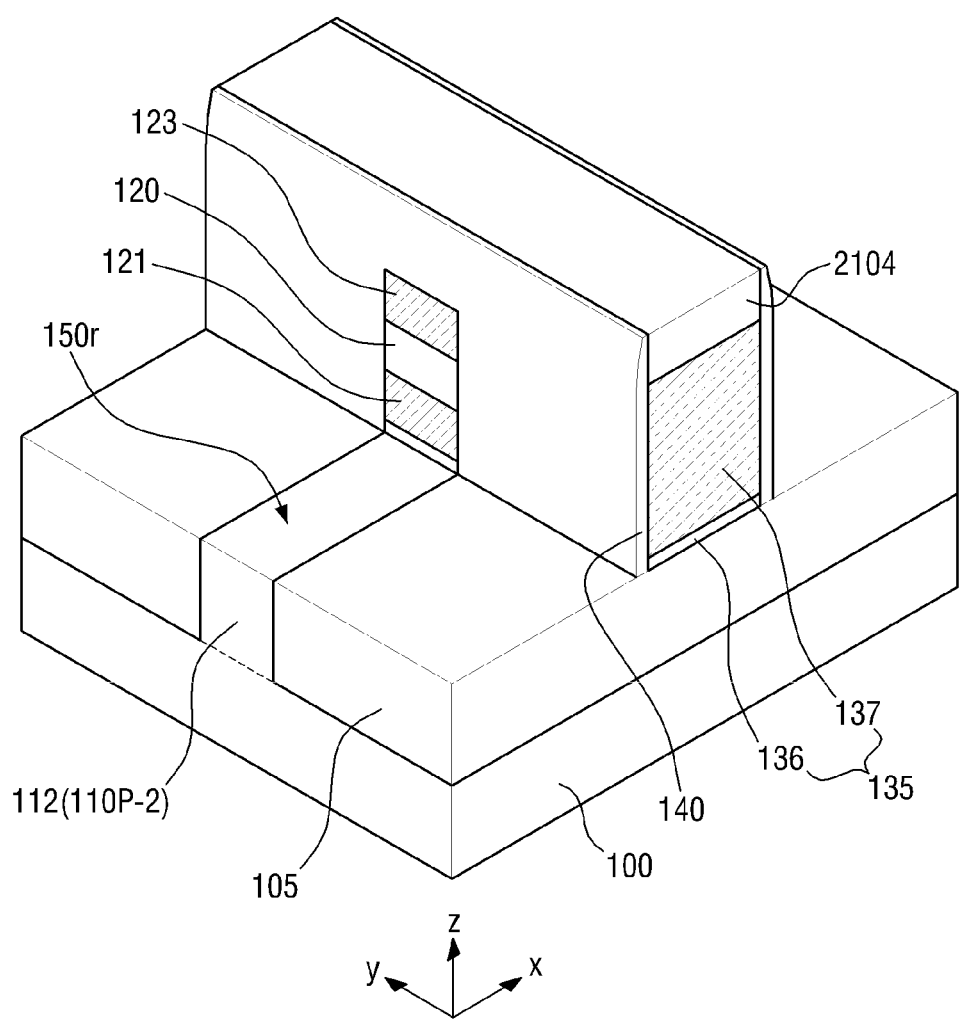

Referring to FIG. 21, gate spacers 140 are formed on sidewalls of the dummy gate pattern 135. That is, the gate spacers 140 are formed on sidewalls of the dummy gate insulating layer 136 and sidewalls of the dummy gate electrode 137.

Specifically, a spacer layer is formed on the filed insulating layer 105 to cover the dummy gate pattern 135 and the fin-type structure 110p. Then, the spacer layer is etched back to form the gate spacers 140 on the sidewalls of the dummy gate pattern 135.

Further, recesses 150r are formed in the second portions 110p-2 of the fin-type structure 110p using the dummy gate pattern 135 including the dummy gate electrode 137 as a mask. A bottom surface of each of the recesses 150r may be the lower pattern 112.

The forming the gate spacers 140 and the forming the recesses 150r may be performed simultaneously, but the present inventive concept is not limited thereto. That is, after the gate spacers 140 are formed, the recesses 150r may be formed in the second portions 110p-2 of the fin-type structure 110p.

In the process of forming the recesses 150r in the second portions 110p-2 of the fin-type structure 110p, the first sacrificial pattern 121 and the second sacrificial pattern 123 in each of the second portions 110p-2 of the fin-type structure 110p may be removed. In addition, when the recesses 150r are formed in the second portions 110p-2 of the fin-type structure 110p, the pre-wire pattern 122 in each of the second portions 110p-2 of the fin-type structure 110p may be removed, thereby forming a first wire pattern 120.

In other words, the first wire pattern 120 may be the pre-wire pattern 122 located in the first portion 110p-1 of the fin-type structure 110p.

Figure 22:
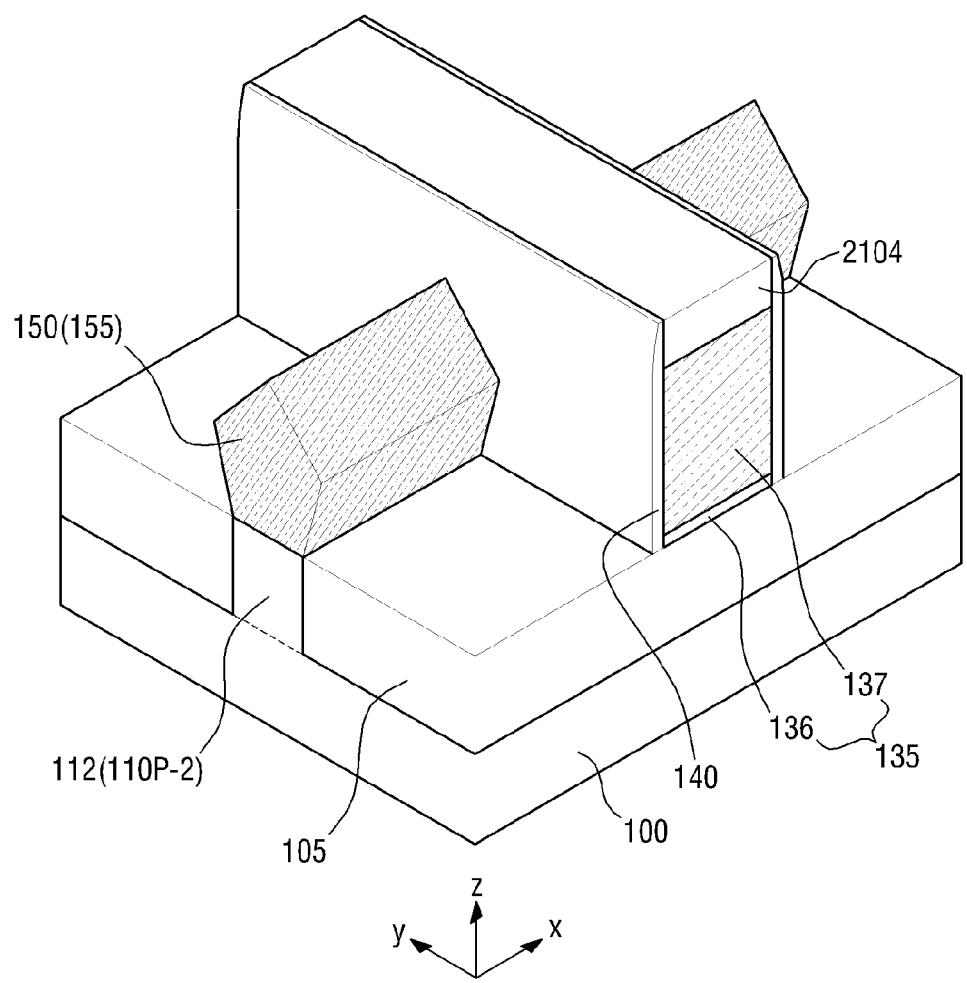

Referring to FIG. 22, an epitaxial layer 155 is formed on the second portions 110p-2 of the fin-type structure 110p to fill the recesses 150r. That is, source/drain regions 150 are formed on both sides of the dummy gate pattern 135.

The source/drain regions 150 are formed on the lower pattern 112 exposed by the recesses 150r.

The source/drain regions 150 may be formed by an epitaxial process. The material of the epitaxial layer 155 included in the source/drain regions 150 may vary according to whether each of the semiconductor devices 1 through 6 according to the above embodiments of the present inventive concept is an n-type transistor or ap-type transistor. If necessary, the source/drain regions 150 may be in-situ doped with impurities during the epitaxial process.

Although not illustrated in FIG. 22, a first epitaxial seed film 160 described above with reference to FIGS. 9 and 10 may be formed before the formation of the epitaxial layer 155.

Figure 23:
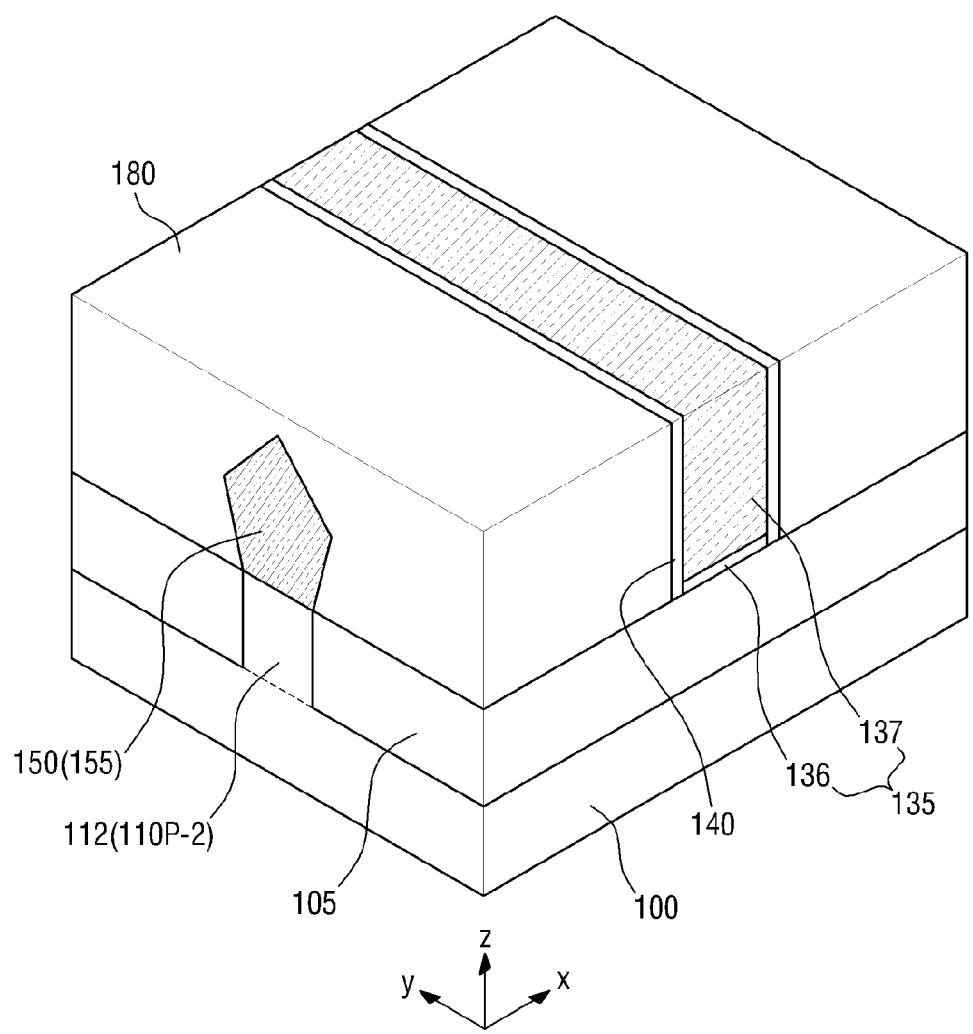

Referring to FIG. 23, an interlayer insulating film 180 is formed on the field insulating layer 105 to cover the source/drain regions 150, the gate spacers 140, the dummy gate pattern 135, the fin-type structure 110p, etc.

The interlayer insulating film 180 may include at least one of a low-k material, an oxide layer, a nitride layer, and an oxynitride layer. The low-k material may be formed of Flowable Oxide (FOX), Tonen SilaZen (TOSZ), Undoped Silica Glass (USG), Borosilica Glass (BSG), PhosphoSilaca (PSG), BoroPhosphoSilica Glass (BPSG), Plasma Enhanced Tetra Ethyl Ortho Silicate (PETEOS), Fluoride Silicate Glass (FSG), High Density Plasma (HDP), Plasma Enhanced Oxide (PEOX), Flowable CVD (FCVD), or any combination of the same.

The interlayer insulating film 180 is planarized until a top surface of the dummy gate electrode 137 is exposed. As a result, the second mask pattern 2104 may be removed, and the top surface of the dummy gate electrode 137 may be exposed.

Figure 24A:
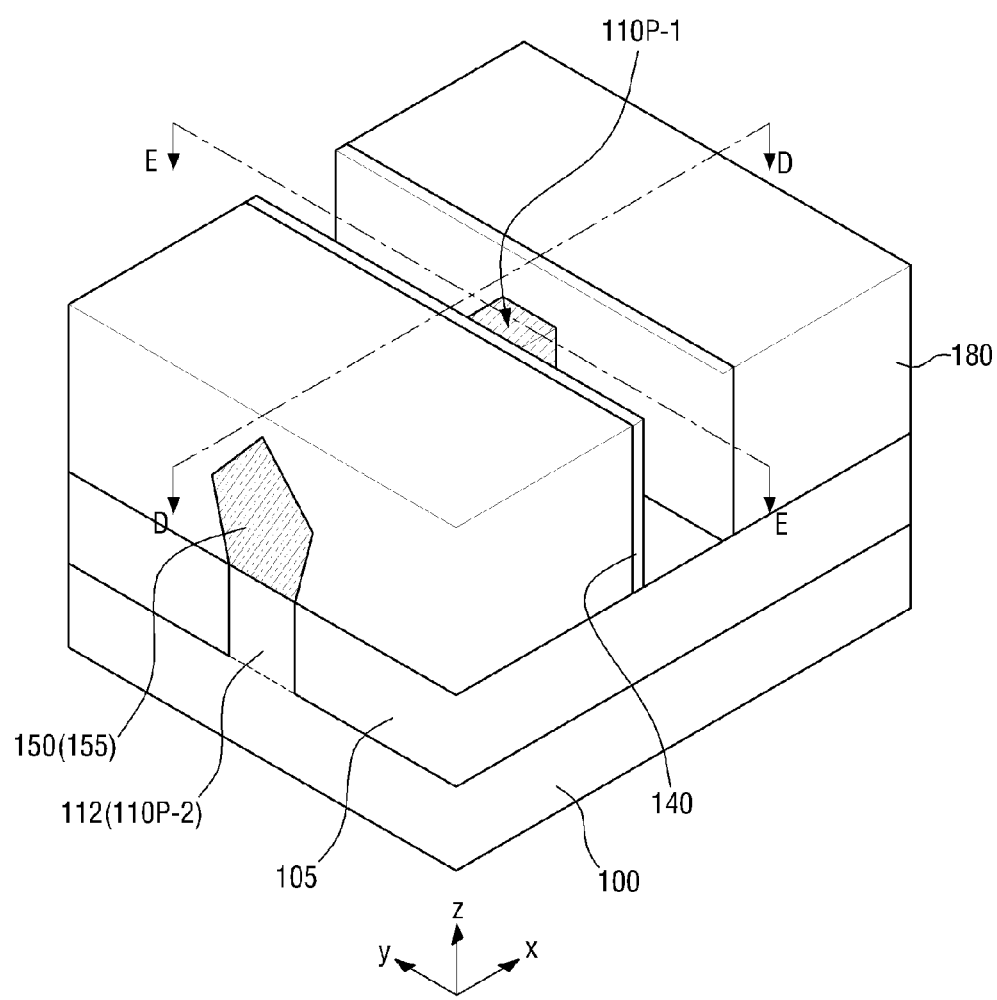
Figure 24B:
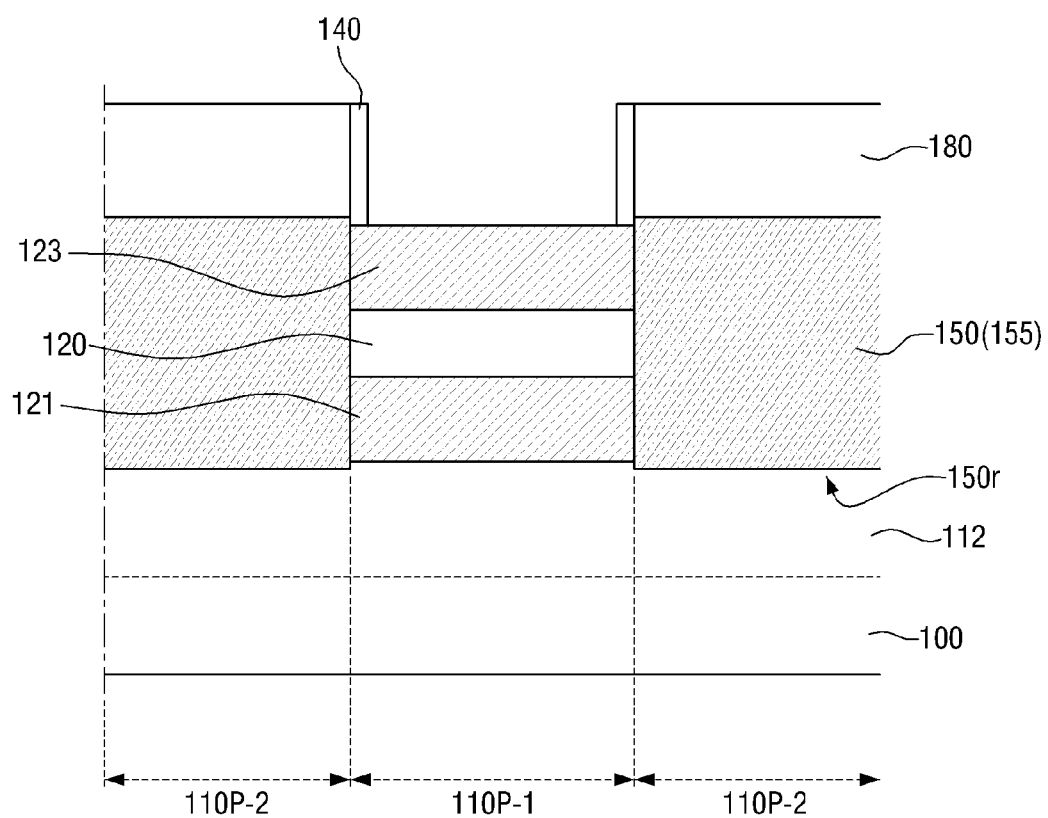
Figure 24C:
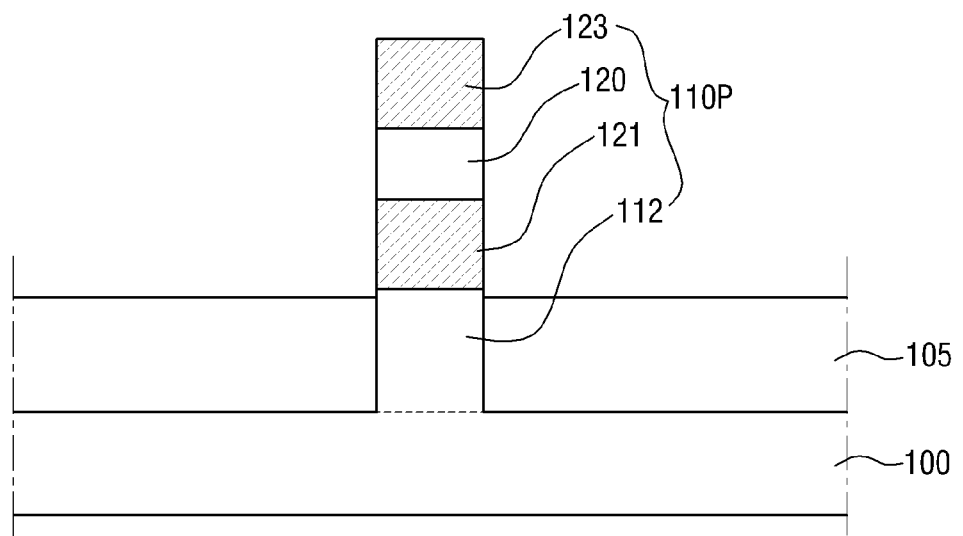

Referring to FIGS. 24A through 24C, the dummy gate pattern 135, that is, the dummy gate insulating layer 136 and the dummy gate electrode 137 are removed.

As the dummy gate insulating layer 136 and the dummy gate electrode 137 are removed, the field insulating layer 105 and a part of the first portion 110p-1 of the fin-type structure 110p are exposed.

Referring to FIGS. 25A through 26, a first upper pattern 115 is formed between the first sacrificial pattern 121 and the lower pattern 112 in the first portion 110p-1 of the fin-type structure 110p. The first upper pattern 115 is an insulating layer pattern including an insulating material.

The first upper pattern 115 may be formed using, e.g., a directional impurity doping process 190 or using an ion implantation process or a plasma assisted doping (PLAD) process. Impurities provided in the directional impurity doping process 190 may can combine with the lower pattern 112 to form an insulating layer pattern. The impurities that can combine with the lower pattern 112 to form the insulating layer pattern may be, but are not limited to, oxygen or nitride.

For example, in the directional impurity doping process 190, oxygen may be provided to an upper portion of the lower pattern 112. As a result, the upper portion of the lower pattern 112 which contacts the first sacrificial pattern 121 may be oxidized. Accordingly, the first upper pattern 115 (i.e., the insulating layer pattern) is formed between the first sacrificial pattern 121 and the lower pattern 112.

The principle of providing impurities to the upper portion of the lower pattern 112 disposed under the first sacrificial pattern 121 will now be described with reference to FIG. 26.

First, a blocking pattern 1001 is formed on a substrate 1000 to be doped. The blocking pattern 1001 serves as a mask in the directional impurity doping process 190. When the directional impurity doping process 190 is performed on the substrate 1000, the impurities are injected to a depth of $X_j$ from a top surface of the substrate 1000.

Here, even if the provided impurities are induced to perpendicularly(?) enter the substrate 1000 by increasing the straightness of the directional impurity doping process 190, they may be injected into the substrate 1000 not only in a vertical direction of the substrate 1000 but also in a horizontal direction of the substrate 1000. That is, the impurities are injected up to a portion covered by the blocking pattern 1001.

The provided impurities diffuse in the horizontal direction because their path may change as they collide with the material that forms the substrate 1000.

Therefore, when the provided impurities are injected to the depth of $X_j$ from the top surface of the substrate 1000, they may diffuse to a portion under the blocking pattern 1001 which is not directly exposed to the directional impurity doping process 190. A distance by which the impurities are diffused may be $\alpha X_j$, where a is is a number greater than zero and less than one and may vary according to the type of the substrate 1000, the type of impurities used, etc.

Referring again to FIGS. 25A and 25B, the impurities provided by the directional impurity doping process 190 may be injected directly into the exposed field insulating layer 105. However, the impurities injected into the field insulating layer 105 may be injected into the lower pattern 112 by lateral diffusion.

Therefore, although the first sacrificial pattern 121, etc. are located on the lower pattern 112, the impurities provided by the directional impurity doping process 190 may be injected into the upper portion of the lower pattern 112.

If the impurities provided by the directional impurity doping process 190 are injected into the first wire pattern 12Q which is to be used as a channel region, the performance of a semiconductor element can be degraded.

Therefore, when the directional impurity doping process 190 is performed to form the first upper pattern 115, the second sacrificial pattern 123 may prevent the impurities from being injected into the first wire pattern 120 thereunder.

The depth $X_j$ to which the impurities are injected into the field insulating layer 105 may vary according to the distance by which the impurities are laterally diffused to the upper portion of the lower pattern 112. In addition, a thickness of the second sacrificial pattern 123 formed on the first wire pattern 120 may be determined by the depth $X_j$.

After the first upper pattern 115 is formed by the directional impurity doping process 190, a heat treatment process may be additionally performed. In the heat treatment process, the first upper pattern 115 may be heat-treated.

In FIG. 25A, the first upper pattern 115 is formed not only in the first portion 110p-1 of the fin-type structure 110p but also in the second portions 110p-2 of the fin-type structure 110p. However, the present inventive concept is not limited thereto. That is, after the directional impurity doping process 190, a width of the first upper pattern 115 in the first direction X can be adjusted by controlling the temperature, duration, etc. of the heat treatment process that can be additionally performed.

Figure 27A:
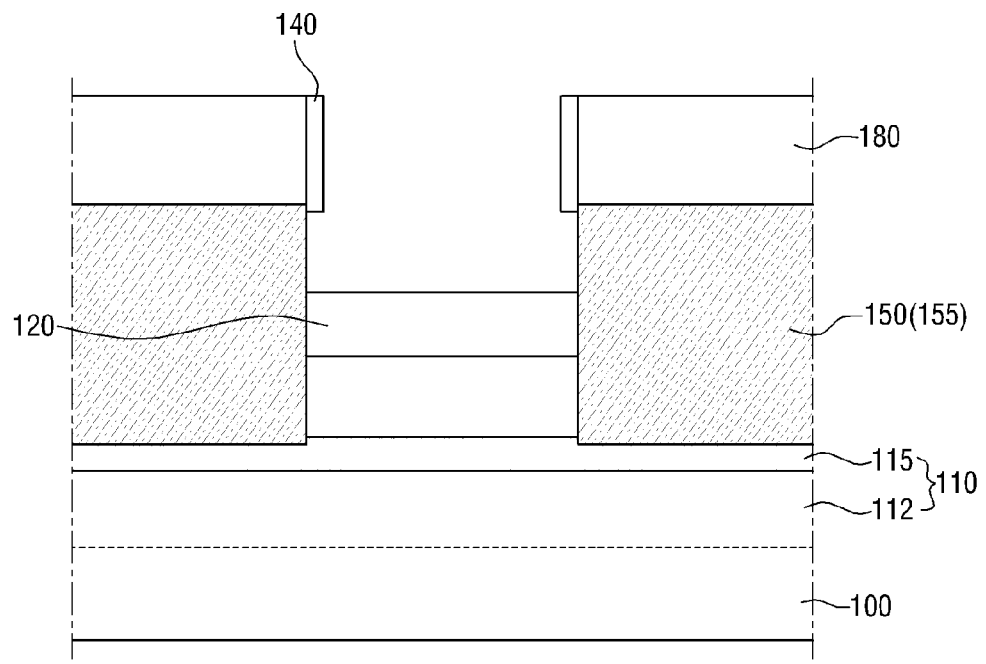
Figure 27B:
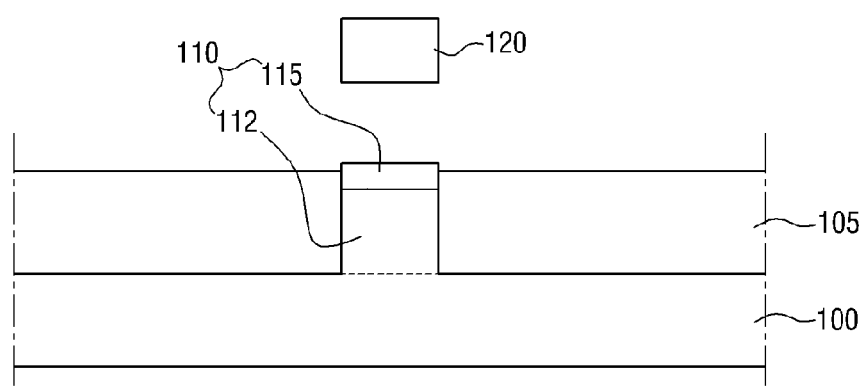

Referring to FIGS. 27A and 27B, the first sacrificial pattern 121 and the second sacrificial pattern 123 in the first portion 110p-1 of the fin-type structure 110p are removed. Accordingly, a space is formed between the first wire pattern 120 and the first upper pattern 115.

The first sacrificial pattern 121 and the second sacrificial pattern 123 formed on and under the first wire pattern 120 may be removed by, e.g., an etching process. The etching process may be performed by using an etch selectivity between the first and second sacrificial patterns 121 and 123 and the first wire pattern 120. In other words, the first wire pattern 120 may have an etch selectivity with respect to the first and second sacrificial patterns 121 and 123.

For example, the first sacrificial pattern 121 and the second sacrificial pattern 123 may be removed using a material having a high etch selectivity with respect to the first sacrificial pattern 121 and the second sacrificial pattern 123, while the first wire pattern 120 is not etched. For example, the first sacrificial pattern 121 and the second sacrificial pattern 123 may include silicon germanium, and the first wire pattern 120 may include silicon. In this case, a high-temperature standard cleaning solution (SC1) may be used, but the present inventive concept is not limited thereto.

As a result of the above process, the fin-type pattern 110 including the lower pattern 112 and the first upper pattern 115 is formed. In addition, the first wire pattern 120 is formed on the fin-type pattern 110.

Referring again to FIG. 12, a gate insulating layer 145 and a first gate electrode 130 are formed to surround the first wire pattern 120.

A method of fabricating a semiconductor device according to some embodiments of the present inventive concept will now be described with reference to FIGS. 17 through 19 and 27A through 33B. A semiconductor device fabricated using the method of FIGS. 17 through 27B is the semiconductor device 5 described above with reference to FIGS. 11 and 12.

Figure 31:
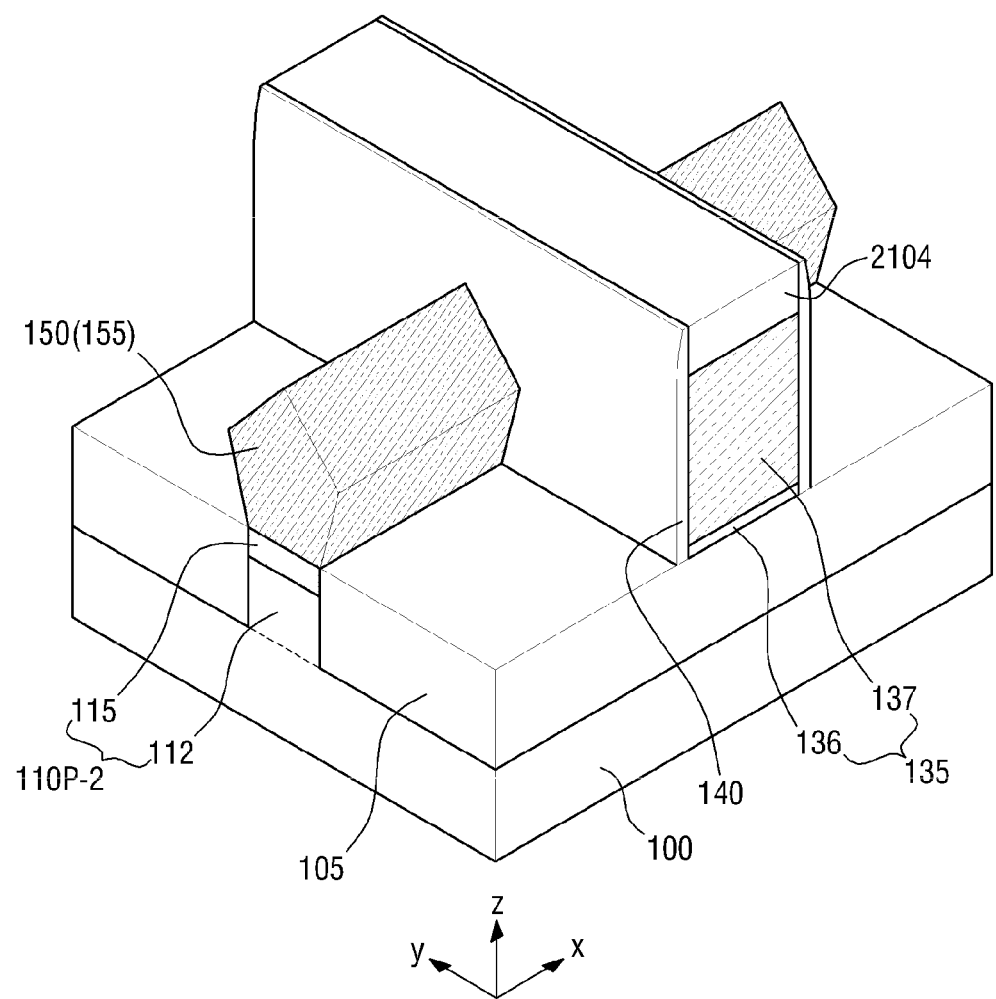
Figure 32:
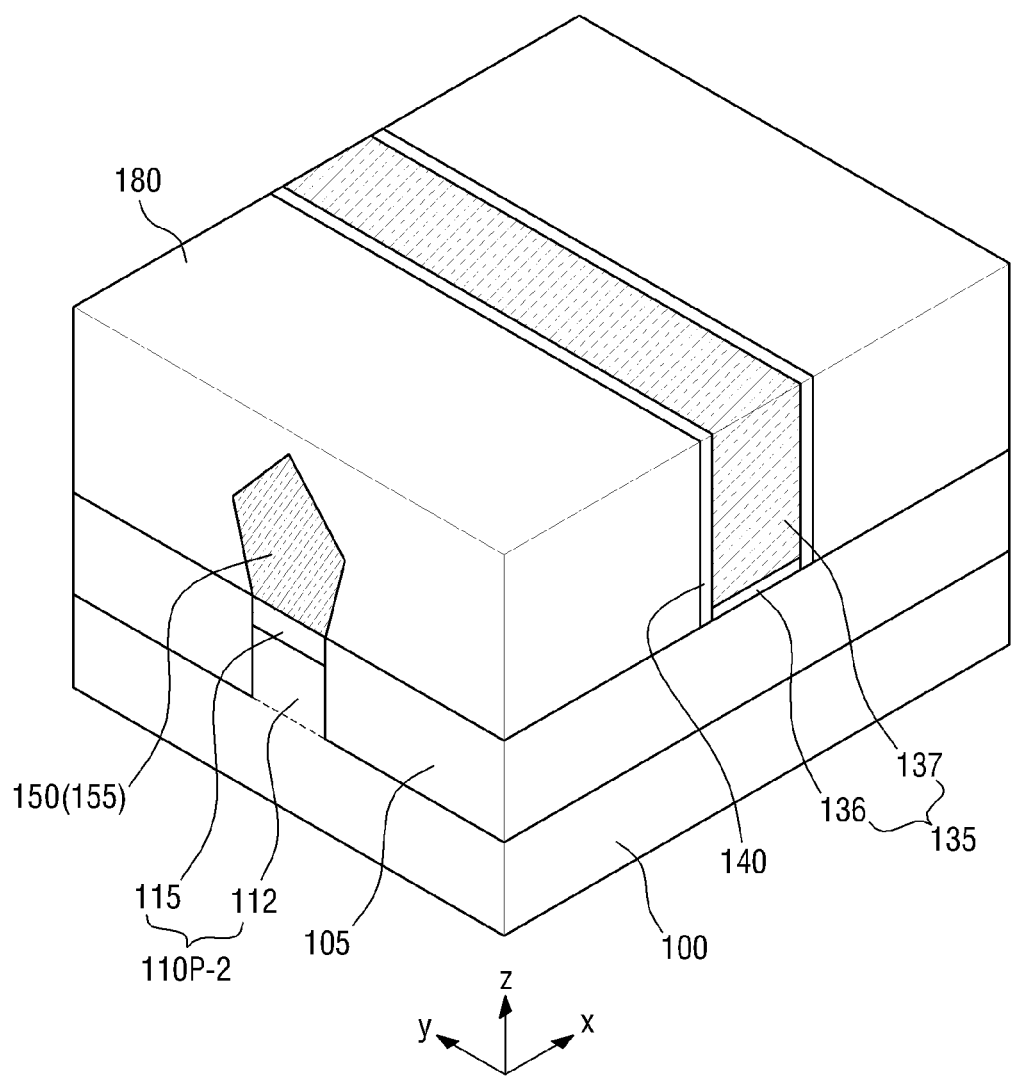
Figure 33A:
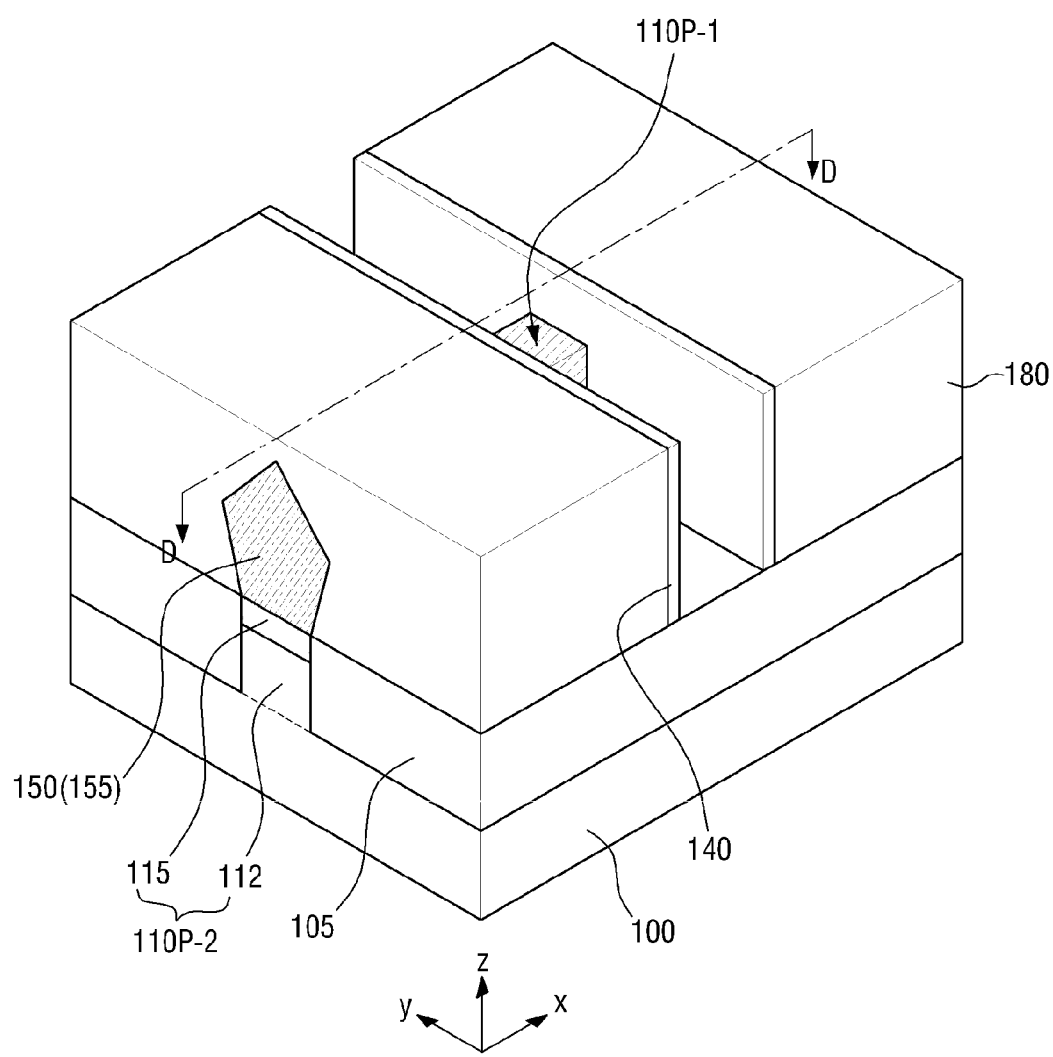
Figure 33B:
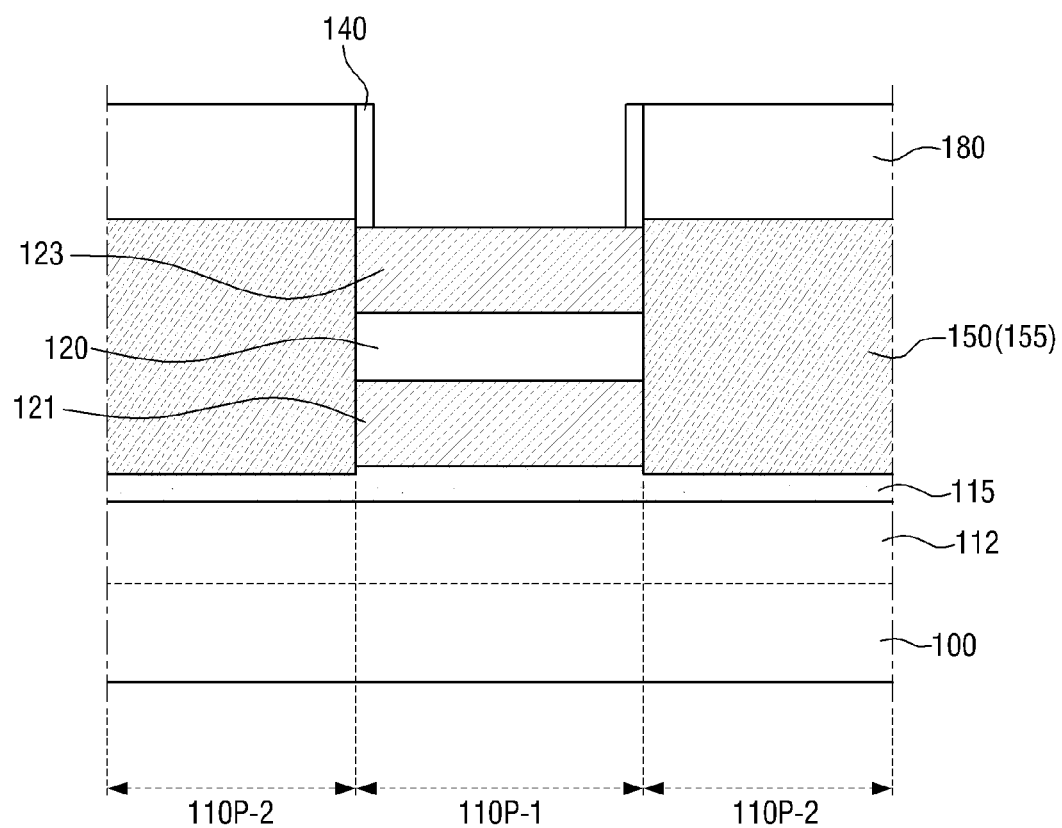

FIGS. 28 through 33B are views illustrating steps of a method of fabricating a semiconductor device according to some embodiments of the present inventive concept. Specifically, FIG. 33B is a cross-sectional view taken along the line D-D of FIG. 33A.

Figure 28:
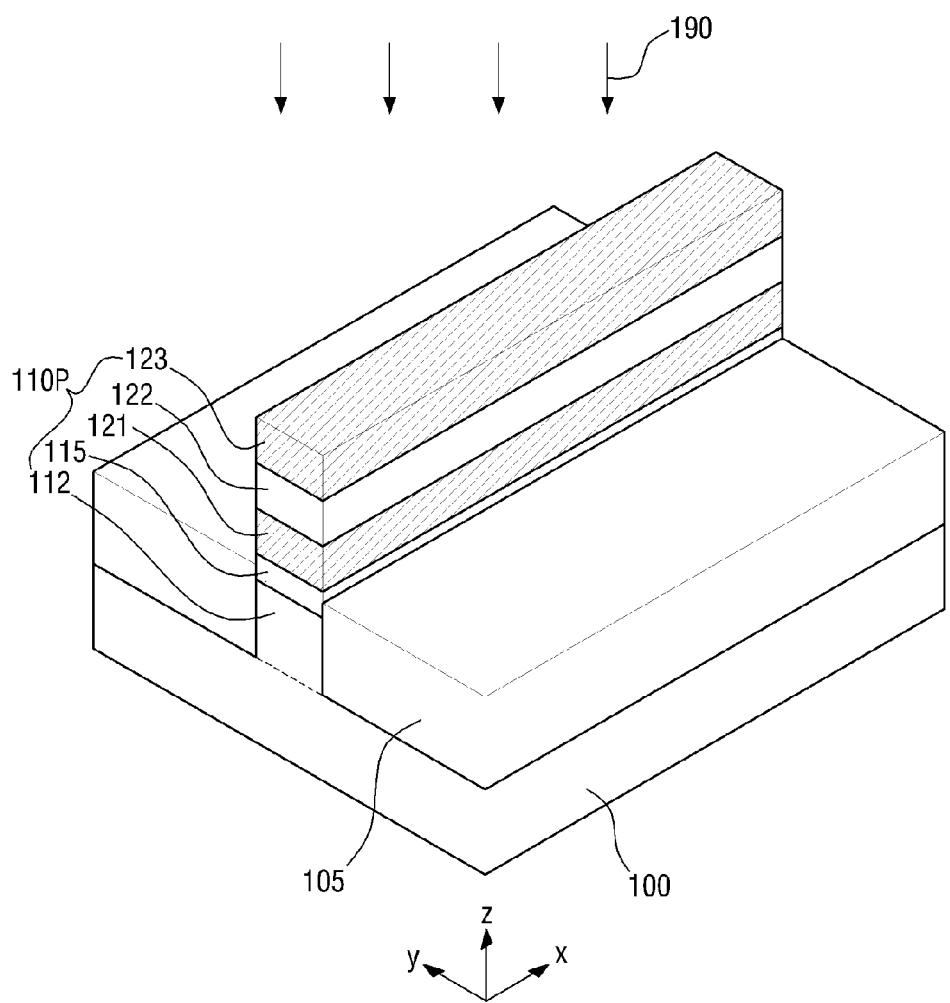
FIGS. 28 through 33B are views illustrating steps of a method of fabricating a semiconductor device according to an example embodiment.

Referring to FIG. 28, a field insulating layer 105 is formed on a substrate 100 to cover at least a part of sidewalls of a fin-type structure 110p. Then, a first upper pattern 115 is formed between a first sacrificial pattern 121 and a lower pattern 112 in a first portion 110p-1 of the fin-type structure 110p.

Since second portions 110p-2 of the fin-type structure 110p are also exposed, the first upper pattern 115 is also formed between the first sacrificial pattern 121 and the lower pattern 112 in each of the second portions 110p-2 of the fin-type structure 110p.

The first upper pattern 115 (i.e., an insulating layer pattern) may be formed using a directional impurity doping process 190.

After the formation of the first upper pattern 115 using the directional impurity doping process 190, a heat treatment process may be additionally performed.

Figure 29:
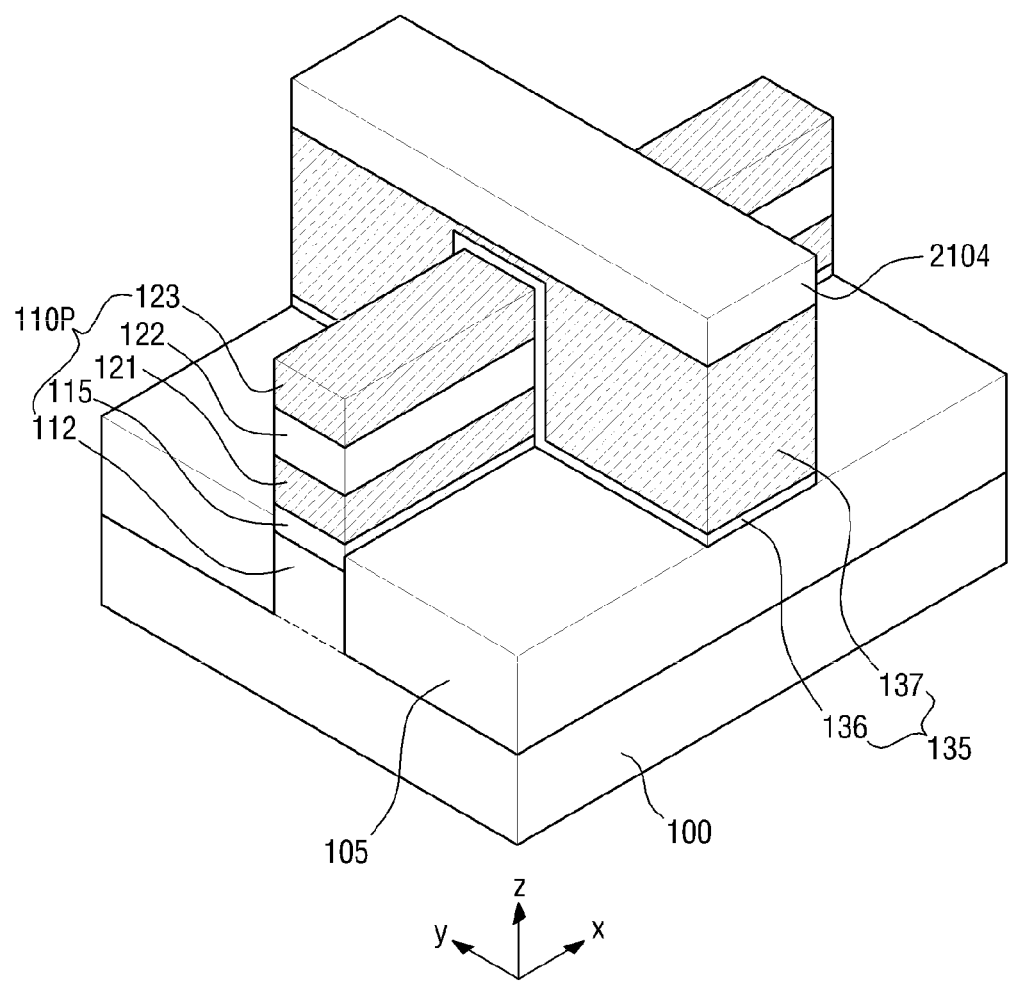

Referring to FIG. 29, an etching process is performed using a second mask pattern 2104, thereby forming a dummy gate pattern 135 which extends along a second direction Y to intersect the fin-type structure 110p.

Accordingly, the dummy gate pattern 135 is formed on the fin-type structure 110p including the first upper pattern 115. The dummy gate pattern 135 is formed on the first portion 110p-1 of the fin-type structure 110p.

Figure 30:
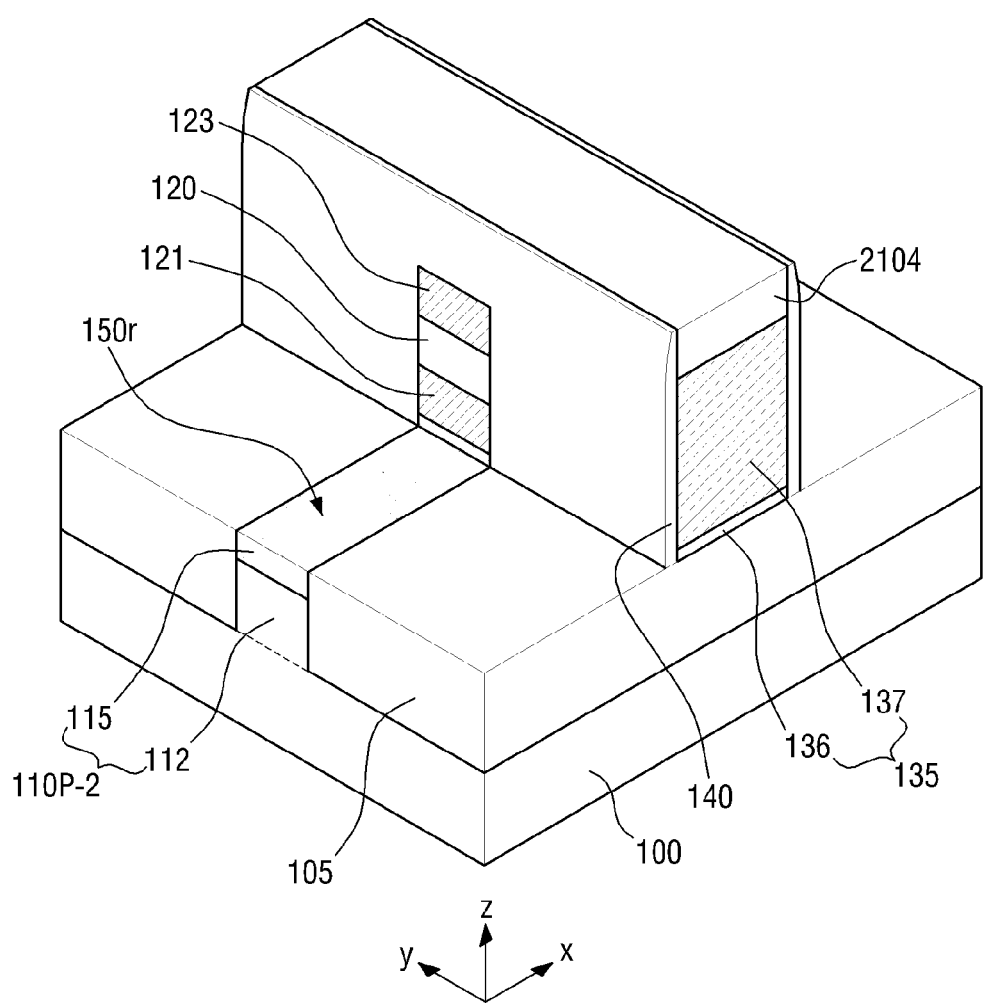

Referring to FIG. 30, gate spacers 140 are formed on sidewalls of the dummy gate pattern 135.

Further, recesses 150r are formed in the second portions 110p-2 of the fin-type structure 110p using the dummy gate pattern 135 including a dummy gate electrode 137 as a mask. A bottom surface of each of the recesses 150r may be, but is not limited to, the first upper pattern 115.

That is, the first sacrificial pattern 121 in each of the second portions 110p-2 of the fin-type structure 110p may not be completely removed. Instead, a portion of the first sacrificial pattern 121 may be left. The left portion of the first sacrificial pattern 121 may serve as a second epitaxial seed film 165 described above with reference to FIGS. 13 and 14, but the present disclosure is not limited thereto.

Referring to FIG. 31, an epitaxial layer 155 is formed on the second portions 110p-2 of the fin-type structure 110p to fill the recesses 150r. That is, source/drain regions 150 are formed on both sides of the dummy gate pattern 135.

If the bottom surface of each of the recesses 150r is the first upper pattern 115 (i.e., the insulating layer pattern), an epitaxial film is not grown on the insulating layer by an epitaxial process.

However, the first sacrificial pattern 121, a first wire pattern 120, and a second sacrificial pattern 123 are exposed through side surfaces of the recesses 150r. Therefore, the epitaxial layer 155 can grow on the exposed first sacrificial pattern 121, the exposed first wire pattern 120, and the exposed second sacrificial pattern 123.

Although not illustrated in FIG. 31, a first epitaxial seed film 160 described above with reference to FIGS. 9 and 10 may be formed on the exposed first sacrificial pattern 121, the exposed first wire pattern 12Q and the exposed second sacrificial pattern 123 before the formation of the epitaxial layer 155.

Referring to FIG. 32, an interlayer insulating film 180 is formed on the field insulating layer 105 to cover the fin-type structure 110p including the source/drain regions 150, the gate spacers 140, the dummy gate pattern 135, and the first upper pattern 115.

Then, the interlayer insulating film 180 is planarized until a top surface of the dummy gate electrode 137 is exposed. As a result, the second mask pattern 2104 may be removed, and the top surface of the dummy gate electrode 137 may be exposed.

Referring to FIGS. 33A and 33B, the dummy gate pattern 135, that is, the dummy gate insulating layer 136 and the dummy gate electrode 137 are removed.

Here, if the first upper pattern 115 includes silicon oxide, it may be partially etched in the process of removing the dummy gate insulating layer 136.

The removal of the dummy gate insulating layer 136 and the dummy gate electrode 137 may partially expose at least a part of the first portion 110p-1 of the fin-type structure 110p including the lower pattern 112, the first upper pattern 115, the first sacrificial pattern 121, the first wire pattern 120, and the second sacrificial pattern 123 stacked sequentially.

Then, the first sacrificial pattern 121 and the second sacrificial pattern 123 are removed, and a gate insulating layer 145 and a first gate electrode 130 are formed.

A method of fabricating a semiconductor device according to some embodiments of the present inventive concept will now be described with reference to FIGS. 17 and 34 through 39, 40A, 40B, 41 and 42.

FIGS. 34 through 42 are views illustrating steps of a method of fabricating a semiconductor device according to some embodiments of the present inventive concept.

Figure 34:
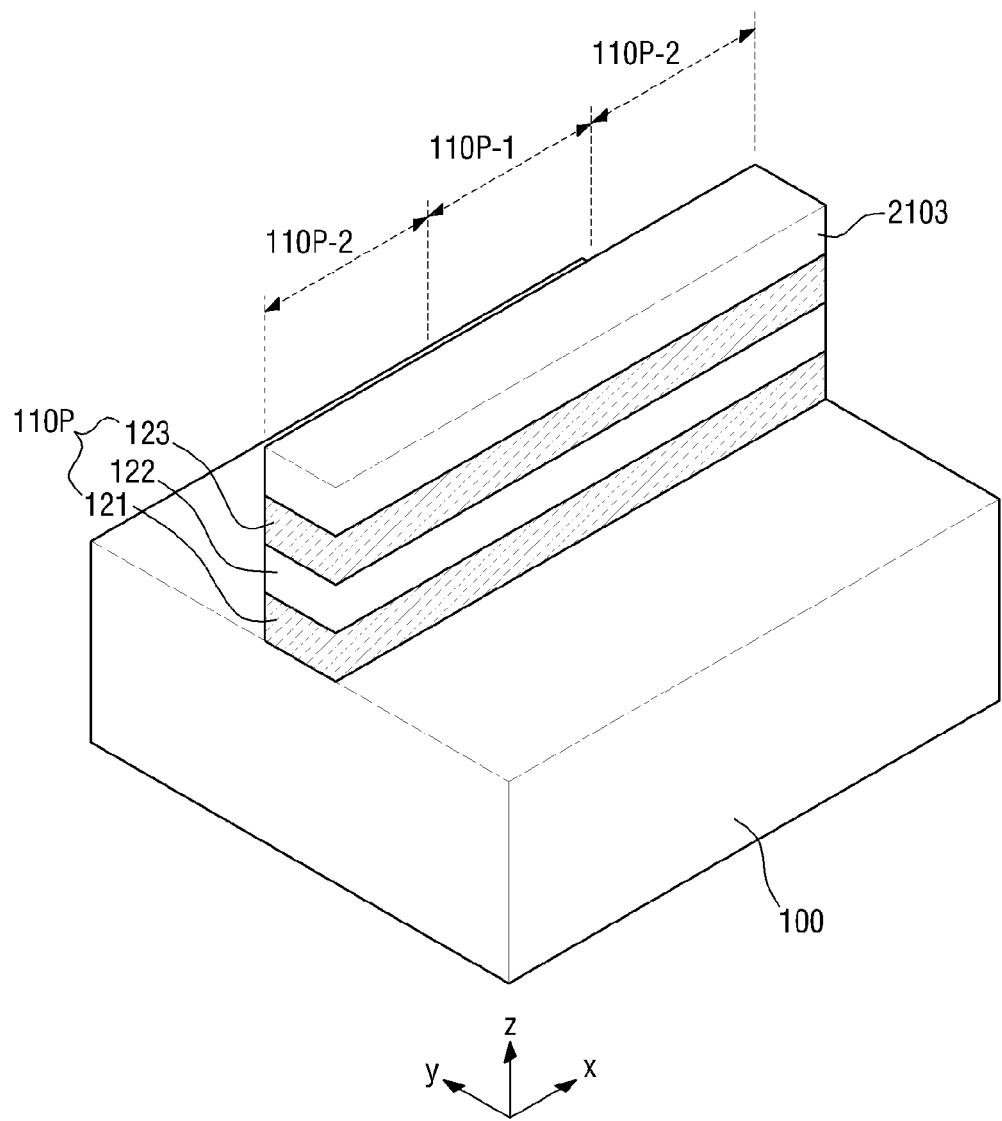
FIGS. 34 through 39, 40A, 40B, 41 and 42 are views illustrating steps of a method of fabricating a semiconductor device according to an example embodiment.

Referring to FIG. 34, an etching process is performed using a first mask pattern 2103 as a mask, thereby forming a fin-type structure 110p.

The fin-type structure 110p may be formed by patterning the second sacrificial layer 2003, the active layer 2002, and the first sacrificial layer 2001 of FIG. 17. The fin-type structure 110p includes a first sacrificial pattern 121, a pre-wire pattern 122, and a second sacrificial pattern 123 stacked sequentially on a substrate 100.

The substrate 100 illustrated in FIG. 34 has not been etched. However, this is merely an example used for ease of description, and the present inventive concept is not limited to this example.

The fin-type structure 110p protruding upward from the substrate 100 may include a first portion 110p-1 and second portions 110p-2. The second portions 110p-2 of the fin-type structure 110p may be located on both sides of the first portion 110p-1 of the fin-type structure 110p in a first direction X.

Figure 35:
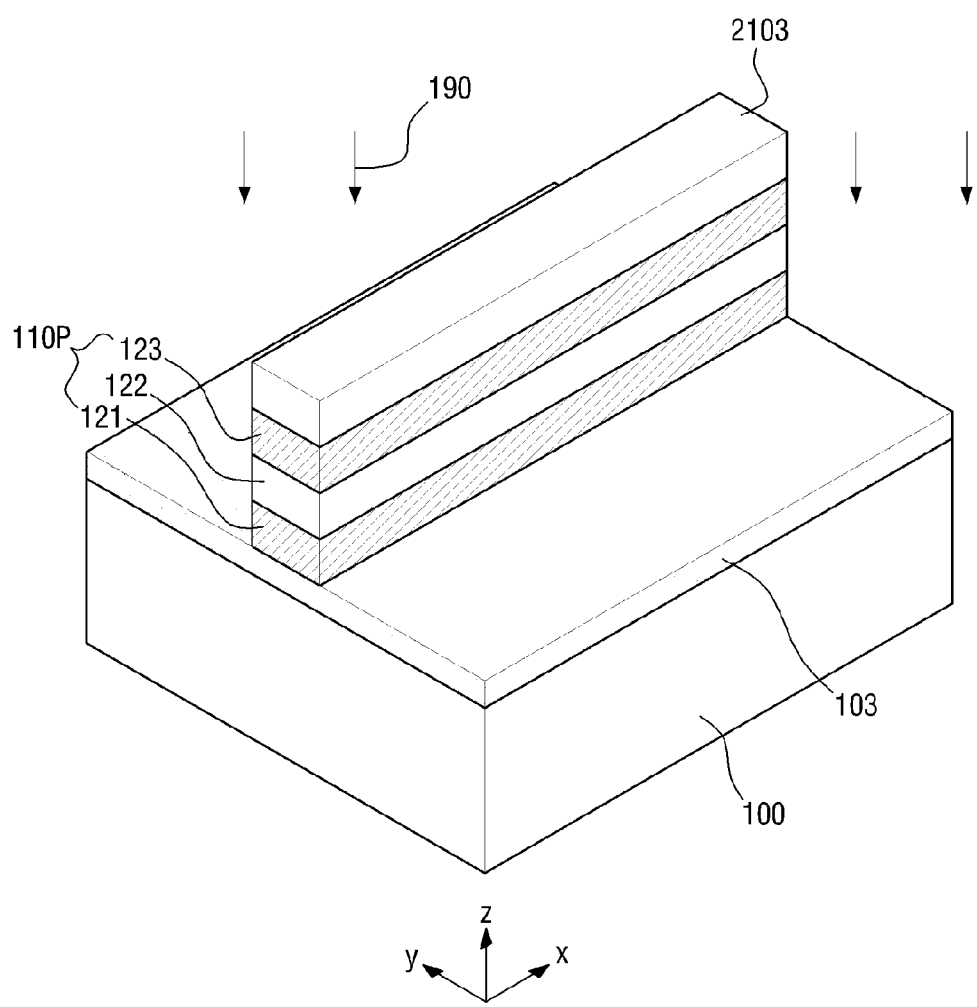

Referring to FIG. 35, an upper portion of the substrate 100 is oxidized using a directional impurity doping process 190. Accordingly, a buried insulating layer 103 is formed between the fin-type structure 110p and the substrate 100.

The buried insulating layer 103 may be formed on the substrate 100, that is, on the whole top surface of the substrate 100.

Figure 36:
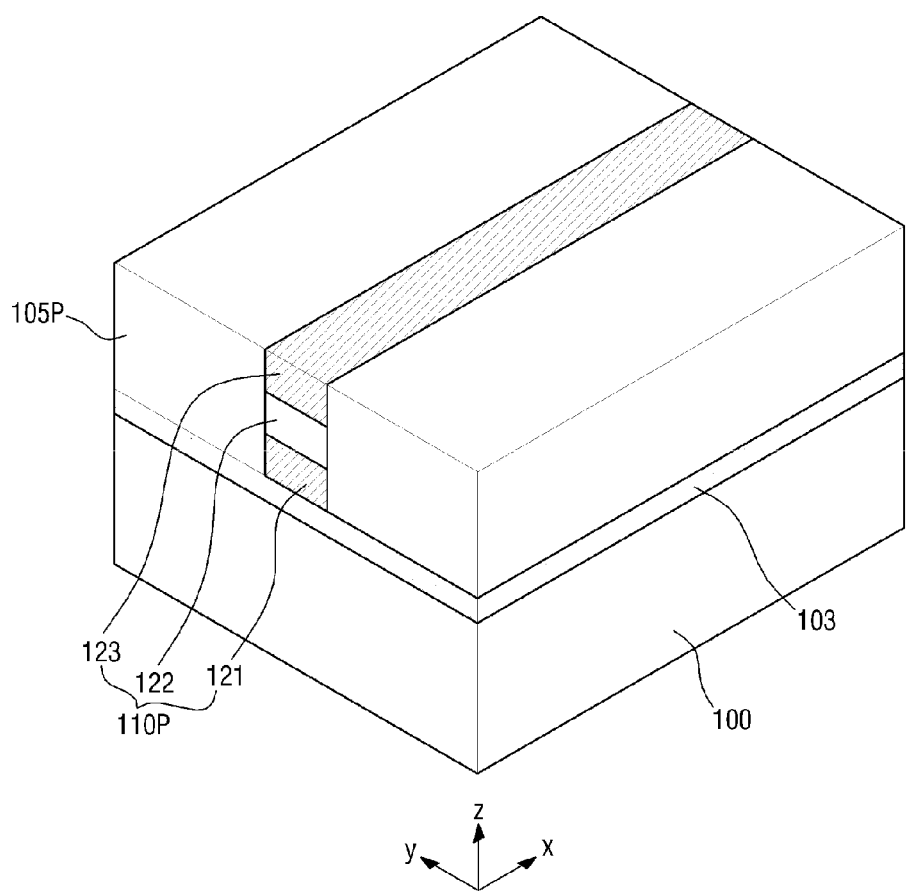

Referring to FIG. 36, a sacrificial field insulating layer 105p is formed to cover the buried insulating layer 103 and the fin-type structure 110p.

Then, the sacrificial field insulating layer 105p is planarized such that a top surface of the fin-type structure 110p lies in the same plane with a top surface of the sacrificial field insulating layer 105p.

A pre-wire pattern 122 may be doped with impurities for controlling a threshold voltage. The buried insulating layer 103 is exposed by removing the sacrificial field insulating layer 105p.

Figure 37:
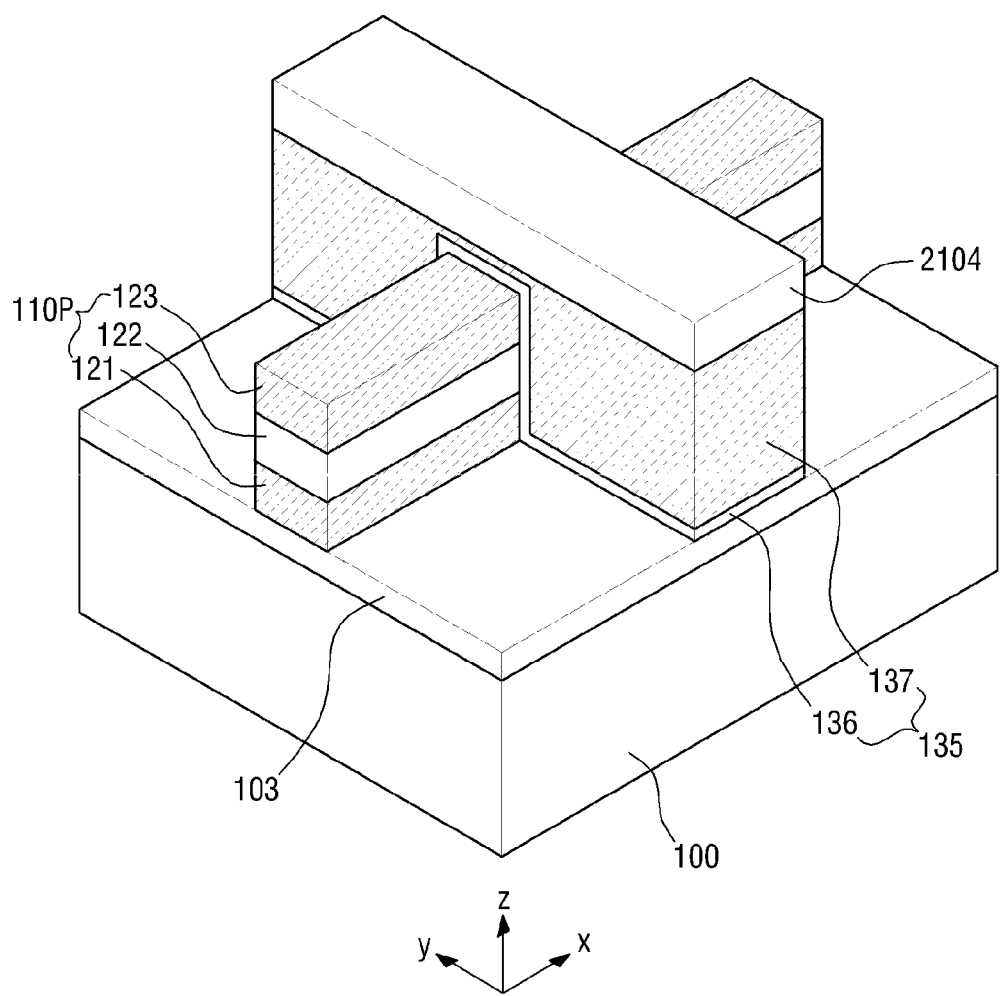

Referring to FIG. 37, an etching process is performed using a second mask pattern 2104, thereby forming a dummy gate pattern 135 which extends along a second direction Y to intersect the fin-type structure 110p.

The dummy gate pattern 135 is formed on the first portion 110p-1 of the fin-type structure 110p. The dummy gate pattern 135 is also formed on the buried insulating layer 103.

Figure 38:
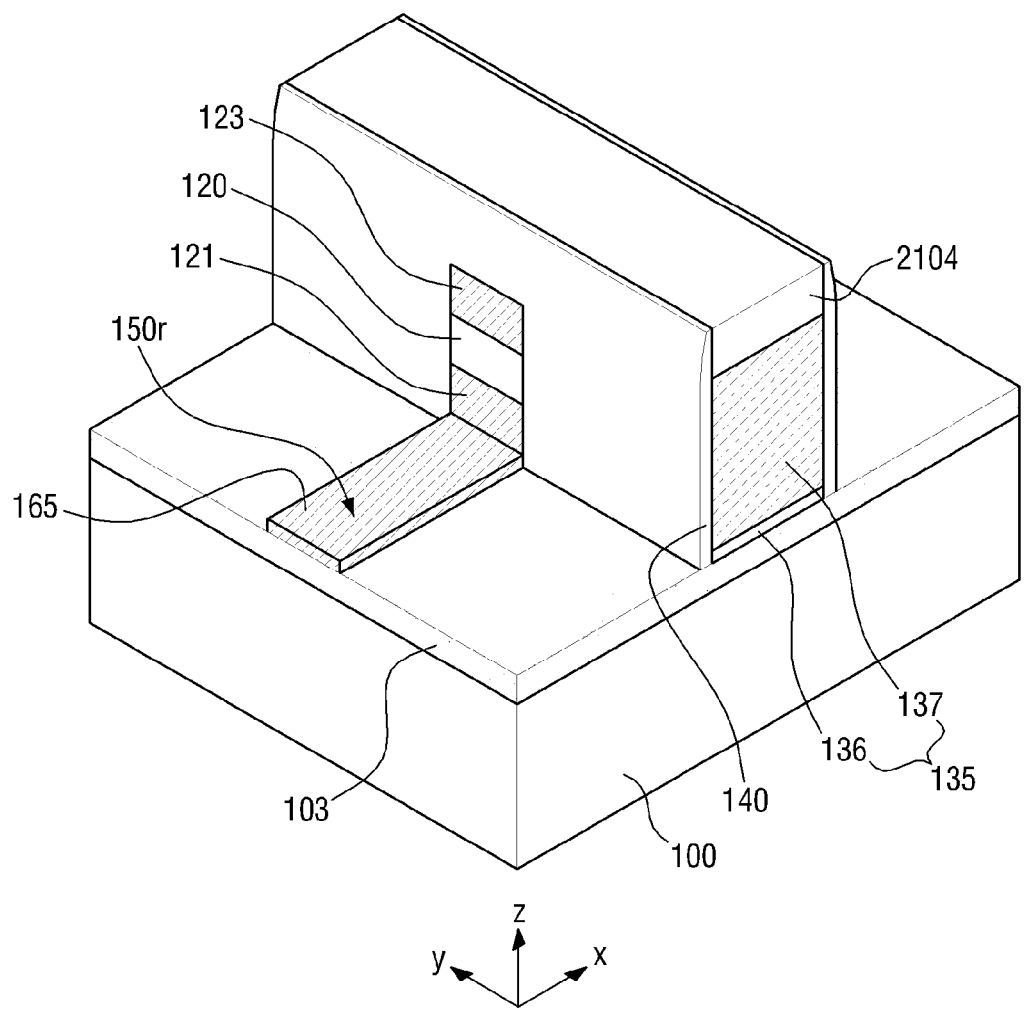

Referring to FIG. 38, gate spacers 140 are formed on sidewalls of the dummy gate pattern 135.

Further, recesses 150r are formed in the second portions 110p-2 of the fin-type structure 110p by using the dummy gate pattern 135 including a dummy gate electrode 137 as a mask. A bottom surface of each of the recesses 150r may be a part of the first sacrificial pattern 121. However, the present inventive concept is not limited thereto. That is, the first sacrificial pattern 121 in the second portions 110p-2 of the fin-type structure 110p may be completely removed. In this case, the bottom surface of each of the recesses 150r may be the buried insulating layer 103.

During the formation of the recesses 150r, the first sacrificial pattern 121 may be partially left, thereby forming a second epitaxial seed film 165.

Figure 39:
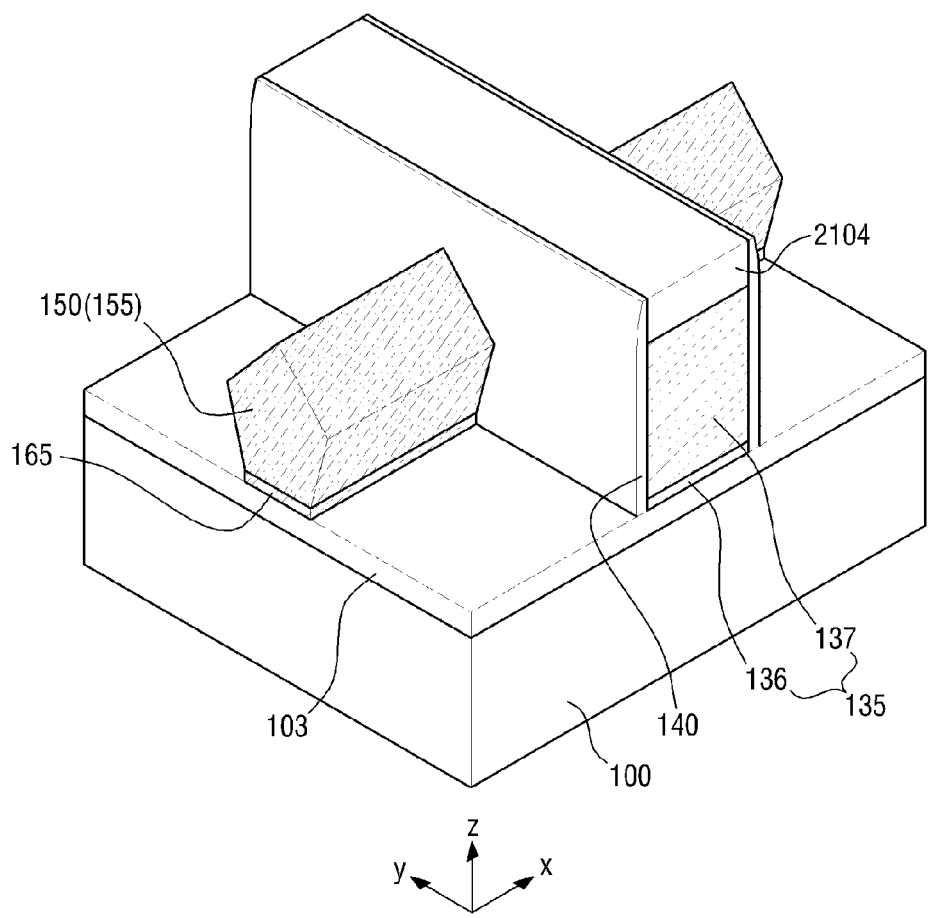

Referring to FIG. 39, an epitaxial layer 155 is formed on the second portions 110p-2 of the fin-type structure 110p to fill the recesses 150r. That is, source/drain regions 150 are formed on both sides of the dummy gate pattern 135.

The epitaxial layer 155 may be formed on the second epitaxial seed film 165 by an epitaxial process.

Although not illustrated in FIG. 39, a first epitaxial seed film 160 described above with reference to FIGS. 9 and 10 may be formed on the exposed first sacrificial pattern 121, an exposed first wire pattern 12Q, and the exposed second sacrificial pattern 123 before the formation of the epitaxial layer 155. In addition, the first epitaxial seed film 160 may be formed on the second epitaxial seed film 165.

Figure 40A:
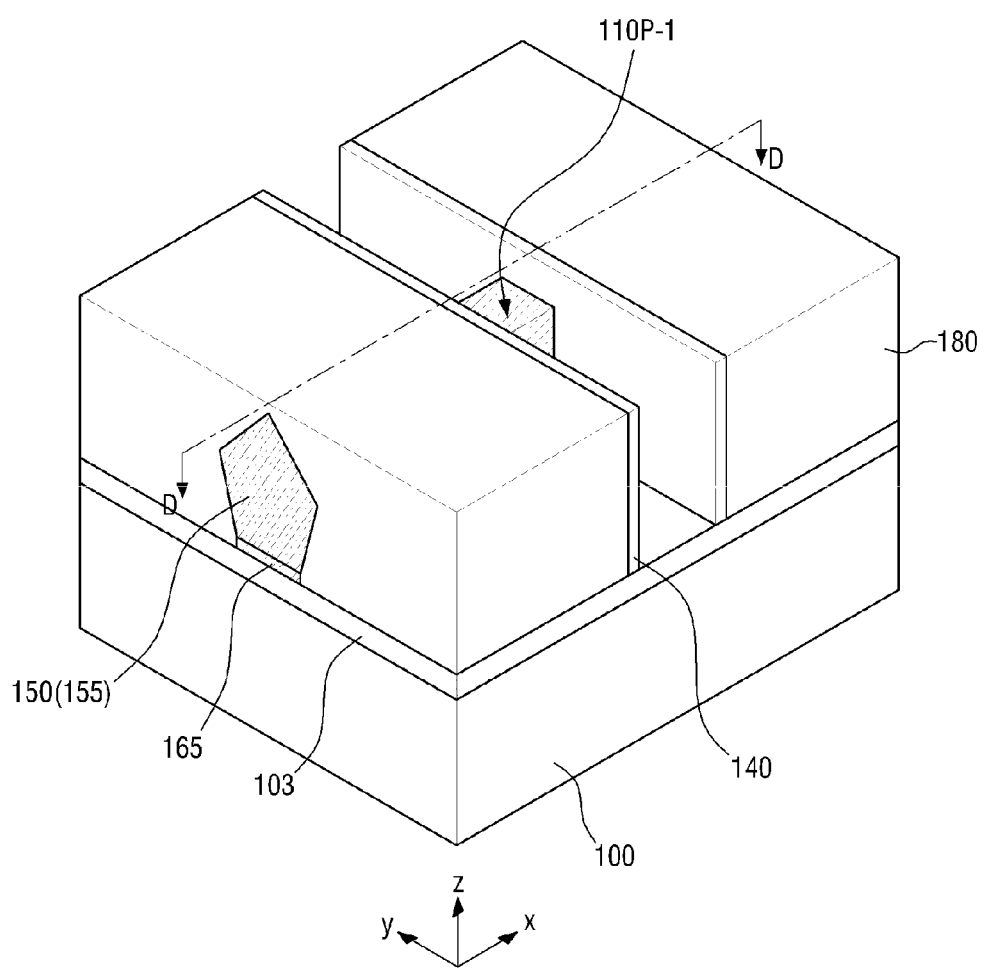
Figure 40B:
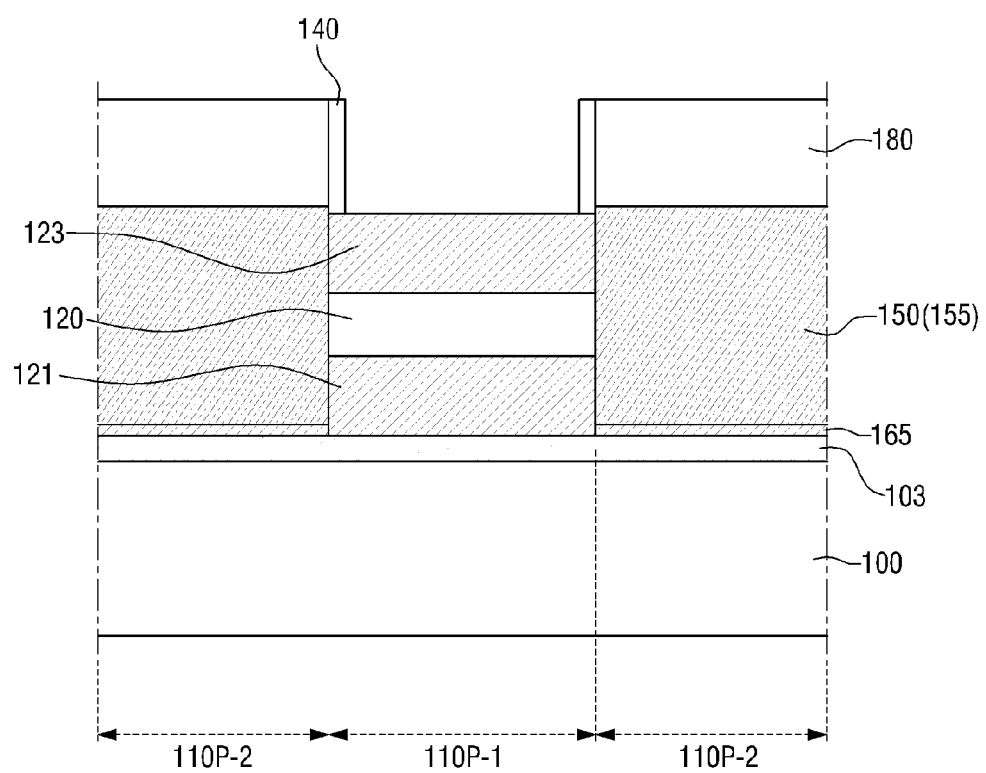

Referring to FIGS. 40A and 40B, an interlayer insulating film 180 is formed on the buried insulating layer 103 to cover the source/drain regions 150, the gate spacers 140, the dummy gate pattern 135, the fin-type structure 110p, etc.

Then, the interlayer insulating film 180 is planarized until a top surface of the dummy gate electrode 137 is exposed. As a result, the second mask pattern 2104 may be removed, and the top surface of the dummy gate electrode 137 may be exposed.

The dummy gate pattern 135, that is, a dummy gate insulating layer 136 and the dummy gate electrode 137 are removed. Accordingly, the buried insulating layer 103 is partially exposed.

In addition, the dummy gate insulating layer 136 and the dummy gate electrode 137 are removed, thereby partially exposing the first portion 110p-1 of the fin-type structure 110p including the first sacrificial pattern 121, the first wire pattern 12Q, and the second sacrificial pattern 123 stacked sequentially.

Figure 41:
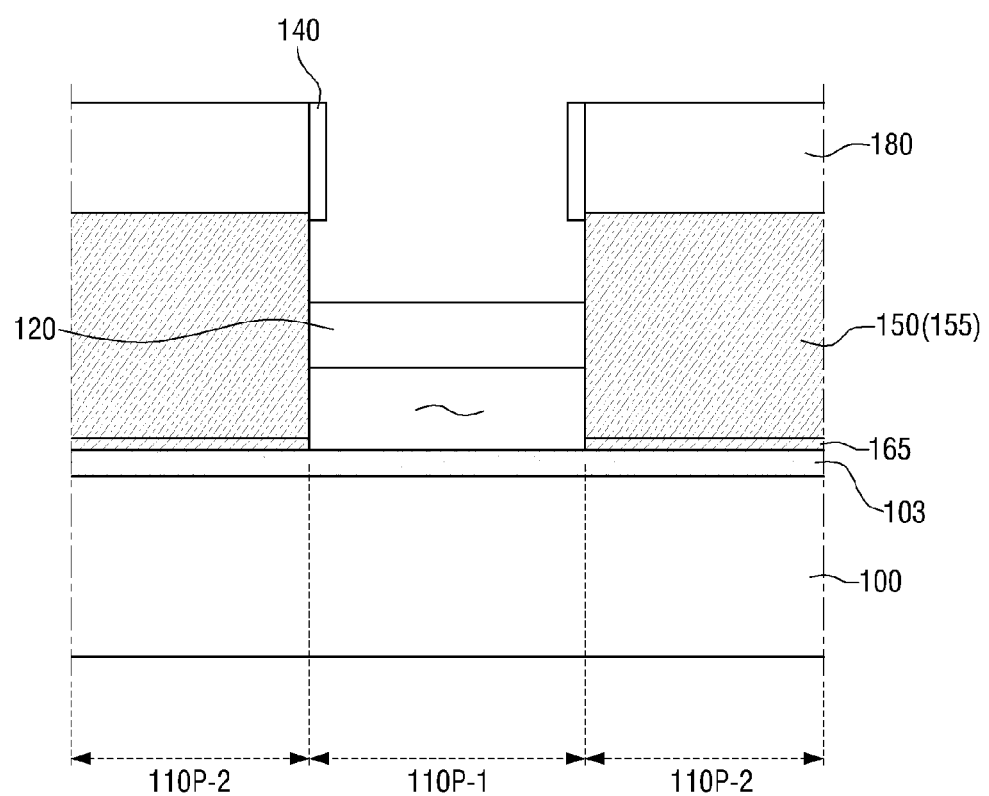

Referring to FIG. 41, the first sacrificial pattern 121 and the second sacrificial pattern 123 in the first portion 110p-1 of the fin-type structure 110p are removed.

Accordingly, a space is formed between the first wire pattern 120 and the buried insulating layer 103.

Figure 42:
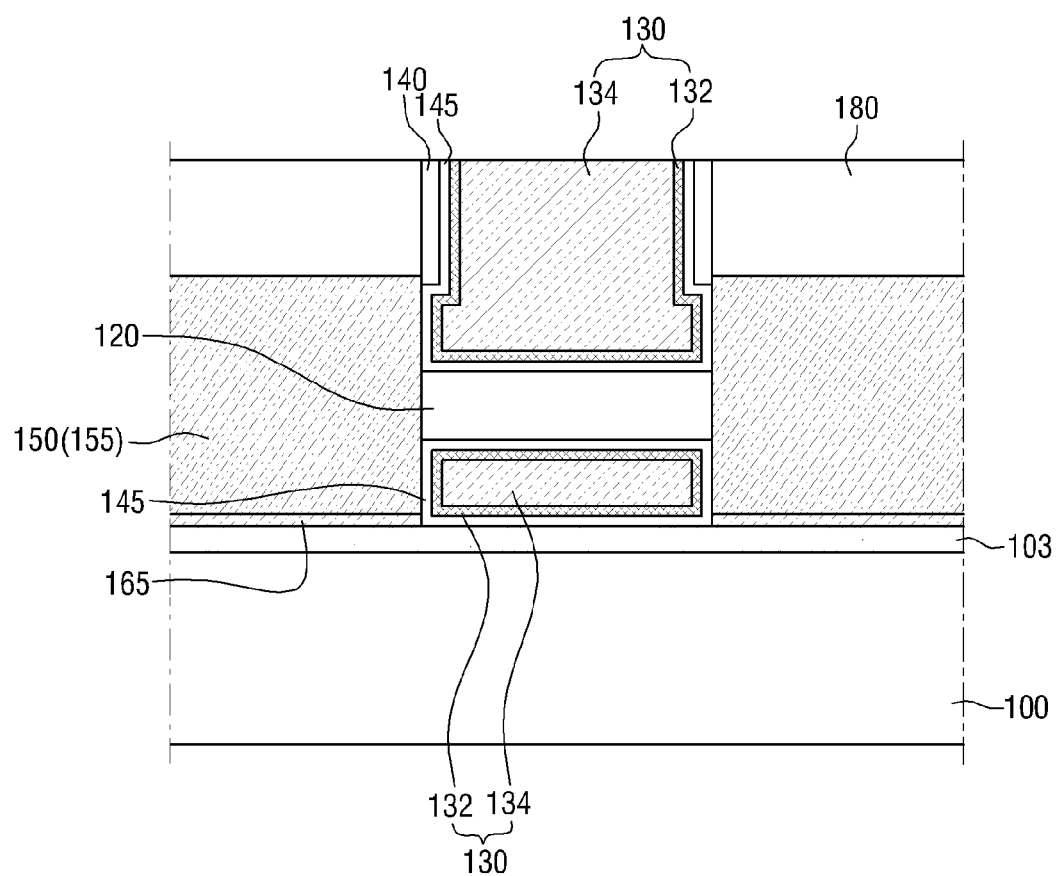

Referring to FIG. 42, a gate insulating layer 15 and a first gate electrode 130 are formed to surround the first wire pattern 120.

Figure 43:
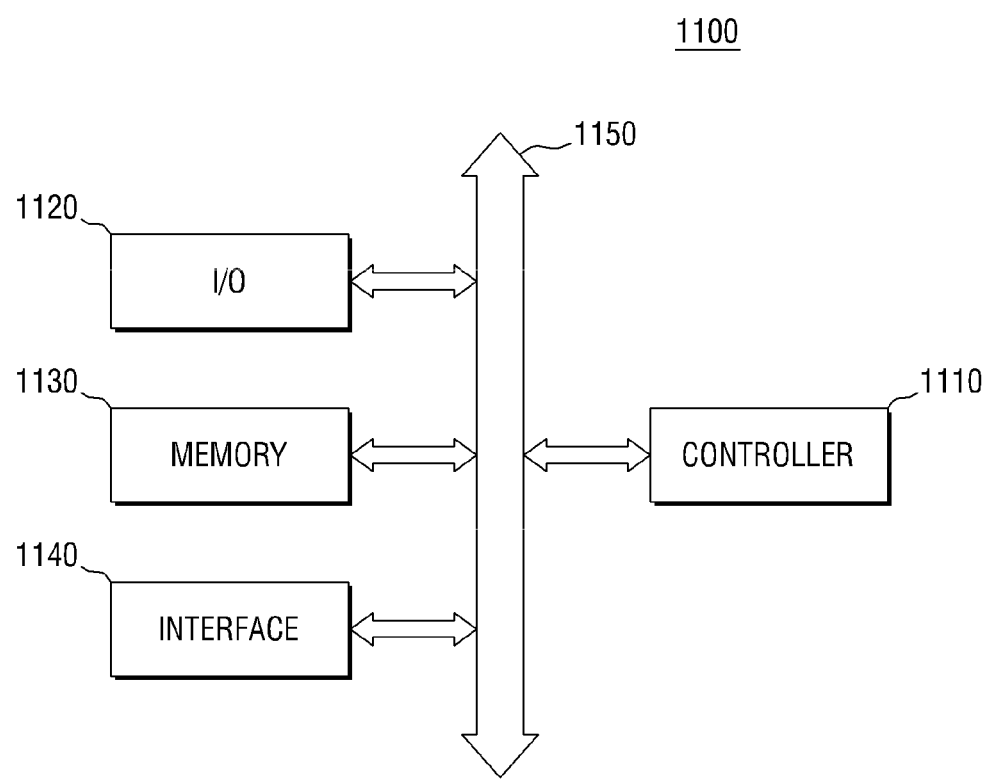
FIG. 43 is a block diagram of an electronic system including a semiconductor device according to example embodiments.

FIG. 43 is a block diagram of an electronic system 1100 including semiconductor devices according to embodiments of the present inventive concept.

Referring to FIG. 43, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. In an example, the interface 1140 may include an antenna or a wired or wireless transceiver. Although not illustrated in the drawing, the electronic system 1100 may further include an operating memory for improving the operation of the controller 1110, such as a high-speed dynamic random access memory (DRAM) and/or static random access memory (SRAM). Any one of the semiconductor devices according to the above-described embodiments may be provided in the memory device 1130 or in the controller 1110 or the I/O device 1120.

The electronic system 1100 may be applied to nearly all types of electronic products capable of transmitting or receiving information in a wireless environment, such as a personal data assistant (PDA), a portable computer, a web tablet, a wireless phone, a mobile phone, a digital music player, a memory card, etc.

Figure 44:
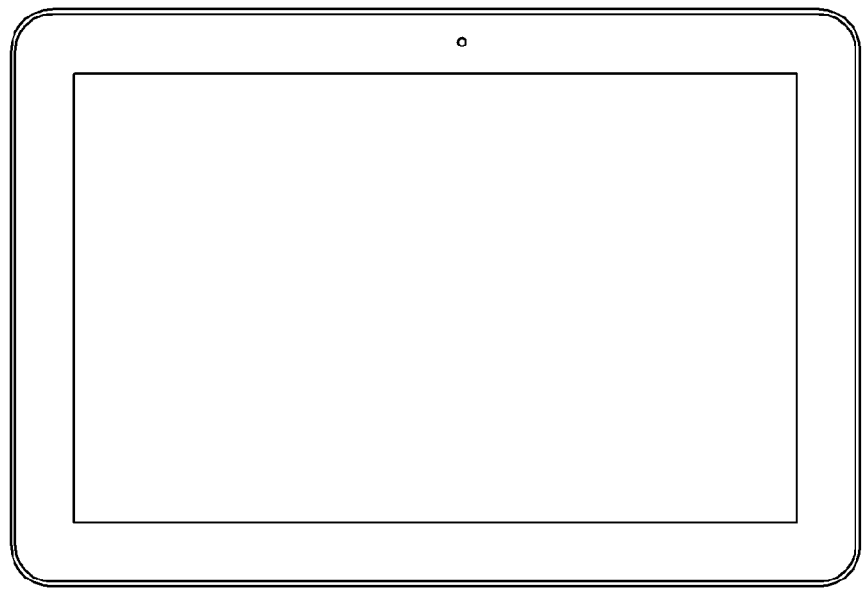
FIGS. 44 and 45 illustrate examples of an electronic system including a semiconductor device according to example embodiments.
Figure 45:
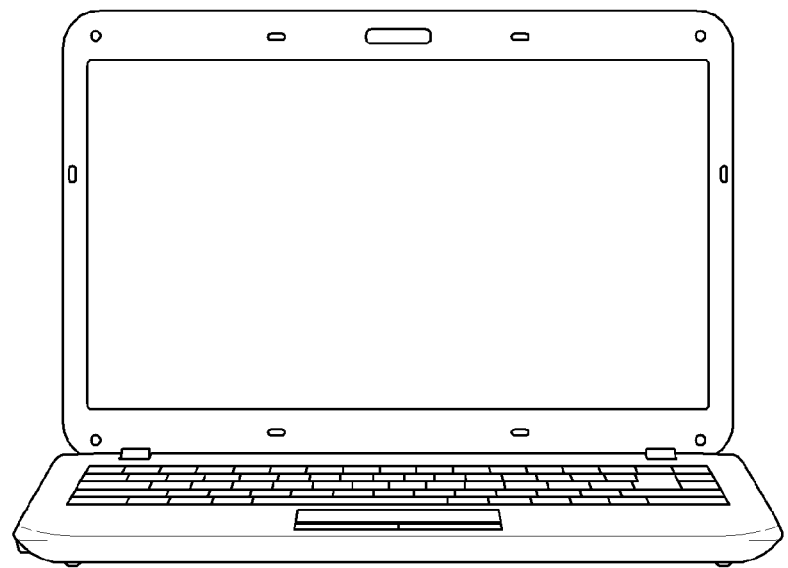

FIGS. 44 and 45 illustrate examples of an electronic system including a semiconductor device according to example embodiments of the present inventive concept.

FIG. 44 illustrates a tablet personal computer (PC), and FIG. 45 illustrates a notebook computer. At least one of the semiconductor devices according to the above-described embodiments of the present inventive concept, as set forth herein, may be used in the tablet PC, the notebook computer, etc. The semiconductor devices according to the embodiments of the present inventive concept, as set forth herein, may also be applied to various integrated circuit (IC) devices other than those set forth herein.

While the present inventive concept has been particularly shown and described with reference to example embodiments thereof, it will be understood by those of ordinary skill in the art that various changes in form and details may be made therein without departing from the spirit and scope of the present inventive concept as defined by the following claims. It is therefore desired that the example embodiments be considered in all respects as illustrative and not restrictive, reference being made to the appended claims rather than the foregoing description to indicate the scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a fin disposed on a substrate, the fin including an insulating layer pattern disposed in a top portion of the fin, and the insulating layer pattern including an oxide material;
   a field insulating layer being on the substrate and covering sidewalls of the fin, a thickness of the field insulating layer being greater than a thickness of the insulating layer pattern;
   a wire pattern disposed on the insulating layer pattern to be separated from the insulating layer pattern;
   a gate electrode surrounding the wire pattern;
   a gate insulating layer between the wire pattern and the gate electrode and between the gate electrode and the insulating layer pattern, the gate insulating layer contacting the insulating layer pattern;
   source/drain regions on both sides of the gate electrode, wherein the source/drain regions are connected to the wire pattern, wherein the source/drain regions comprise respective epitaxial layers disposed on a top surface of the fin, and the epitaxial layers comprise respective first portions and respective second portions, and wherein the wire pattern is disposed between the first portions, and the gate electrode is disposed between the second portions; and
   an epitaxial seed film which comprises a first portion disposed between one of the source/drain regions and the top surface of the fin and a second portion disposed between the one of the source/drain regions and the wire pattern, wherein the epitaxial seed film and the epitaxial layer comprise different materials.

2. A semiconductor device comprising:
   a field insulating layer which is disposed on a substrate and comprises an opening having long sides extending along a first direction and short sides extending along a second direction different from the first direction;
   a first insulating layer pattern which is disposed on the substrate and has long sides extending along the first direction and short sides extending along the second direction, the long sides of the first insulating layer pattern contacting the long sides of the opening, respectively, a thickness of the first insulating layer pattern being smaller than a thickness of the field insulating layer, and the first insulating layer pattern including an oxide material;

a first wire pattern which is disposed on the first insulating layer pattern to be separated from the first insulating layer pattern and extends along the first direction;

a first gate electrode disposed on the field insulating layer and the first insulating layer pattern to surround the first wire pattern;

a gate insulating layer between the first wire pattern and the first gate electrode and between the first insulating layer pattern and the first gate electrode, the gate insulating layer contacting the first insulating layer pattern;

a second insulating layer pattern which is disposed on the substrate and has long sides extending along the first direction and short sides extending along the second direction;

a second wire pattern which is disposed on the second insulating layer pattern to be separated from the second insulating layer pattern and extends along the first direction;

a second gate electrode which is disposed on the field insulating layer and the second insulating layer pattern to surround the second wire pattern;

source/drain regions which are connected to the first wire pattern and the second wire pattern, wherein the long sides of the second insulating layer pattern contact the long sides of the opening; and a semiconductor pattern which protrudes from the substrate and is disposed in the opening, wherein the semiconductor pattern comprises a first portion and second portions disposed on both sides of the first portion in the first direction, wherein the first insulating layer pattern and the second insulating layer pattern are respectively disposed on the second portions of the semiconductor pattern, and each of the source/drain regions is located on the first portion of the semiconductor pattern.

3. The semiconductor device of claim 2, wherein a top surface of the first insulating layer pattern protrudes further upward than a top surface of the field insulating layer.

* * * * *